US012598789B2

(12) United States Patent (10) Patent No.: US 12,598,789 B2

Li et al. (45) Date of Patent: Apr. 7, 2026

(54) SELF-ALIGNED BACKSIDE CONTACT

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Shogo Mochizuki, Mechanicville, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 18/339,260

(22) Filed: Jun. 22, 2023

(65) Prior Publication Data

US 2024/0429097 A1 Dec. 26, 2024

(51) Int. Cl.
| | |
|---|---|
| *H10D 62/10* | (2025.01) |
| *H10D 84/03* | (2025.01) |
| *H10W 20/41* | (2026.01) |

(52) U.S. Cl.
CPC ......... *H10D 62/121* (2025.01); *H10D 84/038* (2025.01); *H10W 20/427* (2026.01)

(58) Field of Classification Search
CPC .......... H10D 30/6735; H10D 30/6757; H10D 62/121; H10D 84/038; H01L 23/5286; H01L 21/743; H10W 20/427
See application file for complete search history.

(56) References Cited

U.S. PATENT DOCUMENTS

| | | | |
|---|---|---|---|
| 9,466,723 B1 | 10/2016 | Huang | |
| 10,797,139 B2 | 10/2020 | Morrow et al. | |
| 11,264,481 B2 | 3/2022 | Park | |
| 2021/0111115 A1 | 4/2021 | Morrow | |
| 2021/0134721 A1 | 5/2021 | Chiang | |
| 2021/0134795 A1* | 5/2021 | Ju | H10D 64/518 |
| 2021/0202385 A1 | 7/2021 | Huang | |
| 2021/0305252 A1 | 9/2021 | Chiang | |
| 2021/0305381 A1 | 9/2021 | Chiang | |
| 2021/0351303 A1 | 11/2021 | Ju | |
| 2021/0376071 A1 | 12/2021 | Liu | |
| 2021/0376093 A1 | 12/2021 | Chu | |
| 2021/0399099 A1 | 12/2021 | Chu | |

(Continued)

FOREIGN PATENT DOCUMENTS

| | | |
|---|---|---|
| CN | 121195617 A | 12/2025 |
| WO | 2023/078652 A1 | 5/2023 |
| WO | 2024/260916 A2 | 12/2024 |

OTHER PUBLICATIONS

International Searching Authority, "Notification of Transmittal of the International Search Report and the Written Opinion of the International Searching Authority, or Declaration," Patent Cooperation Treaty, Dec. 23, 2024, 18 pages, International Application No.-PCT/ EP2024/066793, IBM Docket No. P202204206PCT01.

*Primary Examiner* — Changhyun Yi

(74) *Attorney, Agent, or Firm* — L. Jeffrey Kelly

(57) ABSTRACT

A semiconductor structure including a first transistor including a first placeholder and a first gate pitch and a second transistor including a second placeholder and a second gate pitch, where the first gate pitch is less than the second gate pitch, and wherein the first placeholder is smaller than the second placeholder.

20 Claims, 21 Drawing Sheets

SECTION X₂-X₂

(56)        References Cited

U.S. PATENT DOCUMENTS

| | | |
|---|---|---|
| 2022/0139911 A1 | 5/2022 | Wei |
| 2022/0352339 A1 | 11/2022 | Wang |
| 2022/0384244 A1 | 12/2022 | Chang |
| 2022/0392898 A1 | 12/2022 | Ghani |
| 2023/0063607 A1 | 3/2023 | Bae et al. |

* cited by examiner

FIN/STACK

FIN/STACK

X₁

X₂

X₁

X₂

1ˢᵗ Array

2ⁿᵈ Array

GATE
REGION

GATE
REGION

GATE
REGION

GATE
REGION

GATE
REGION

GATE
REGION

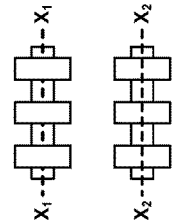
1st Array
2nd Array
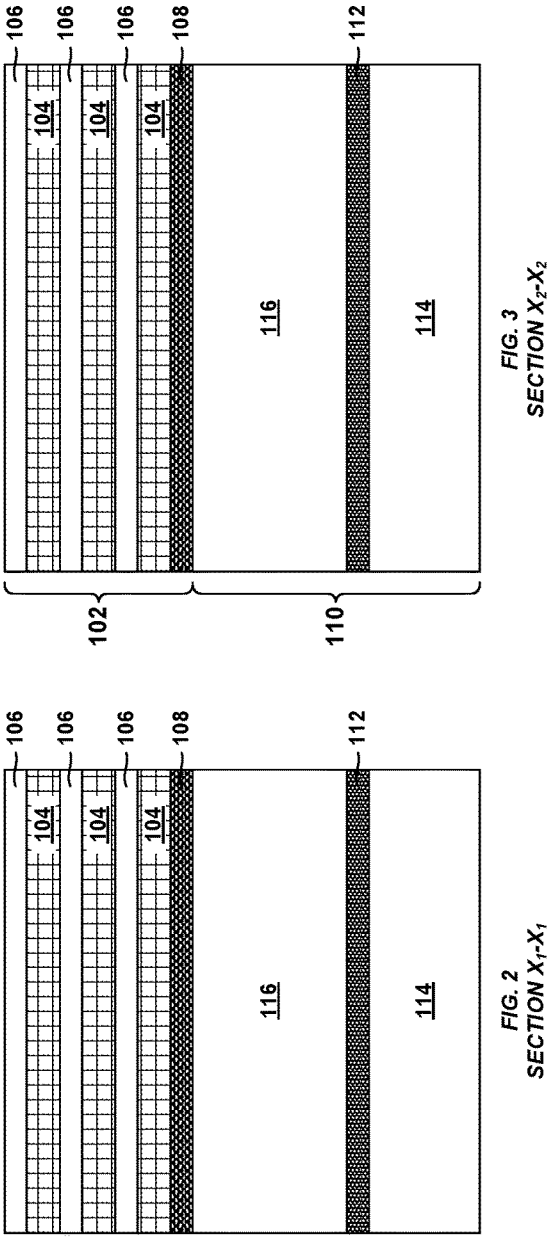
FIG. 2
SECTION X₁-X₁
FIG. 3
SECTION X₂-X₂

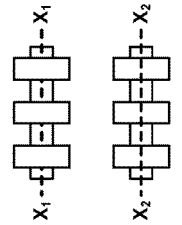
1st Array
2nd Array
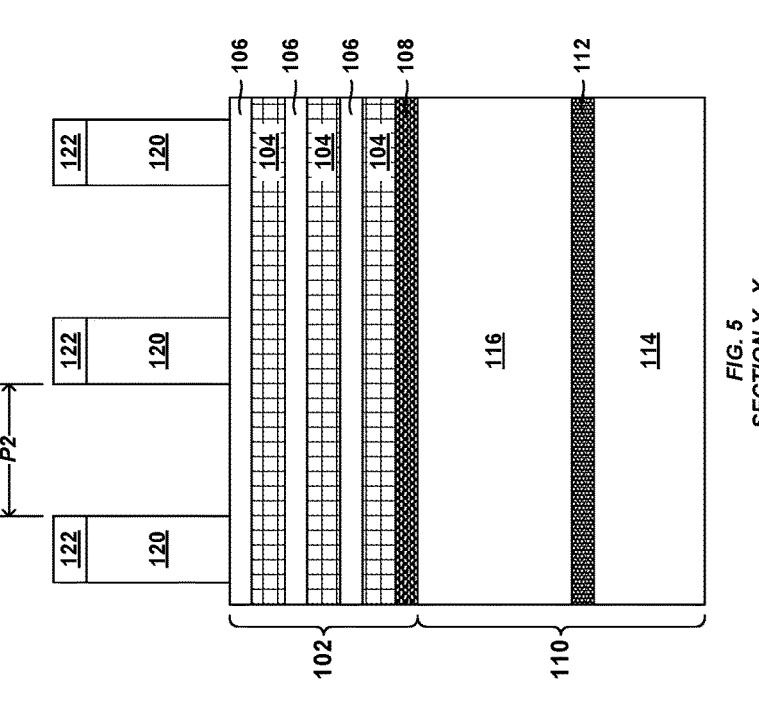
FIG. 5
SECTION X₂-X₂
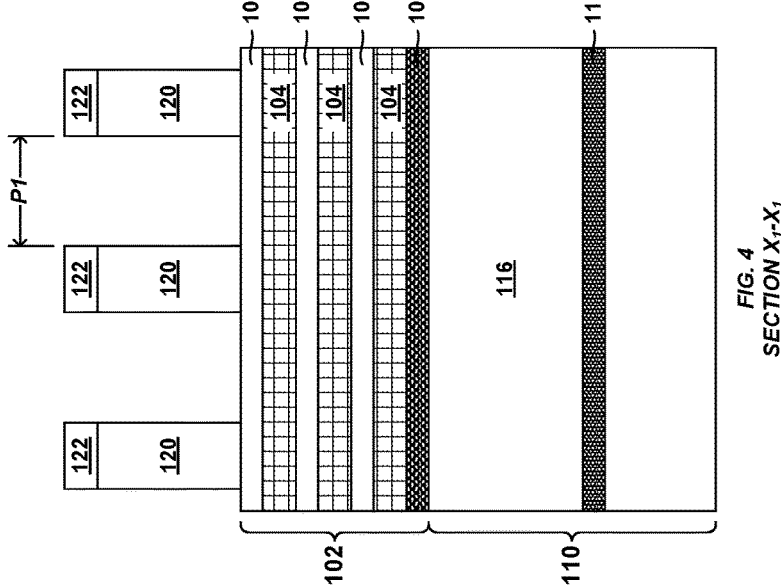
FIG. 4
SECTION X₁-X₁
100

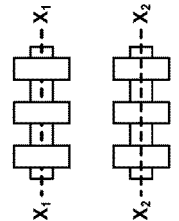
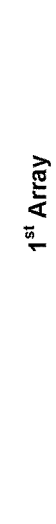
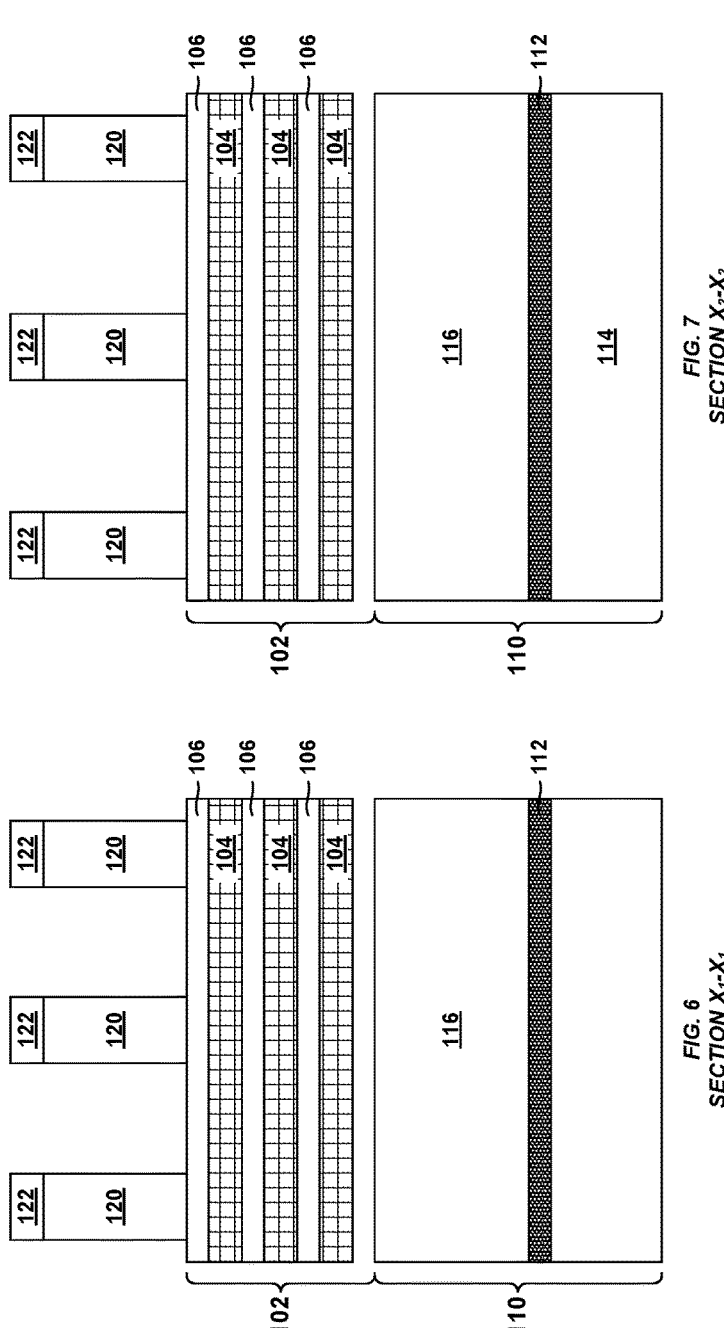
1st Array
2nd Array
FIG. 6
SECTION $X_1$-$X_1$
FIG. 7
SECTION $X_2$-$X_2$

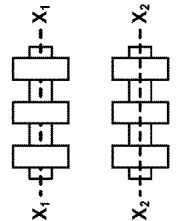
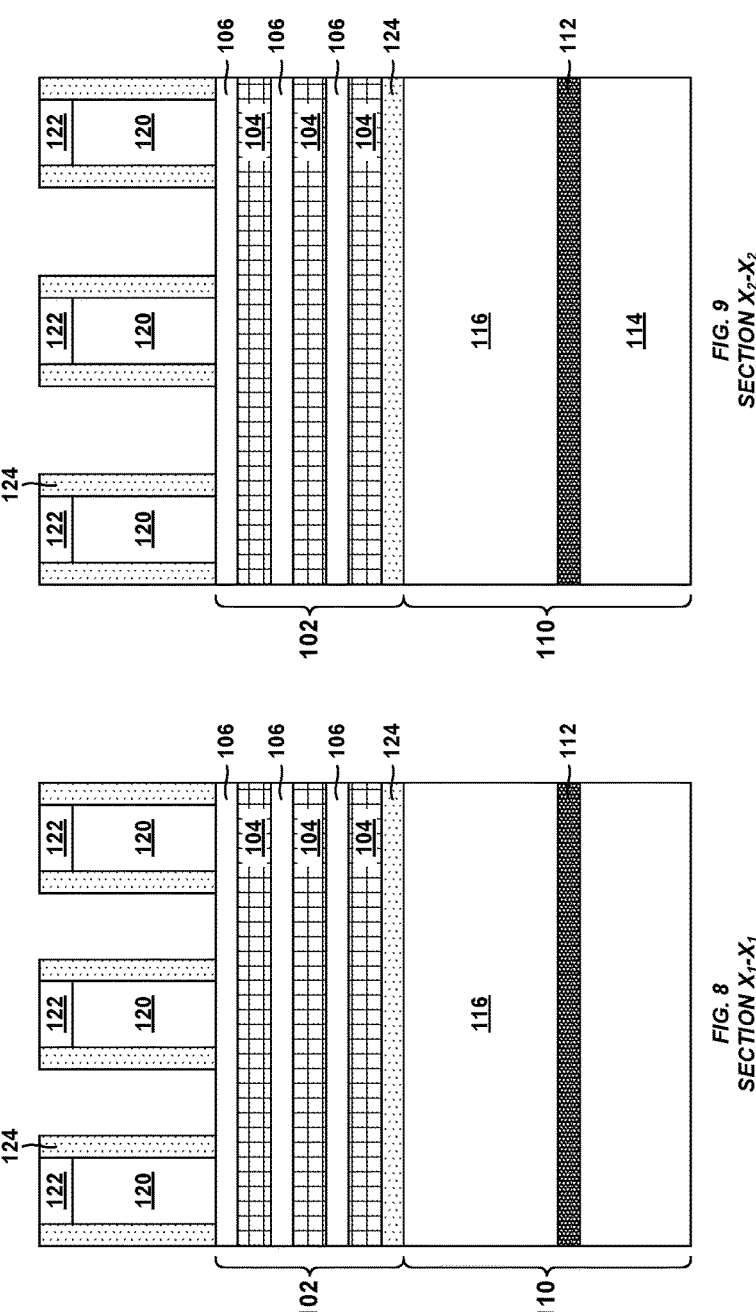

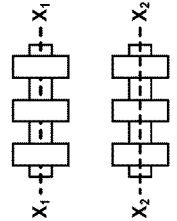
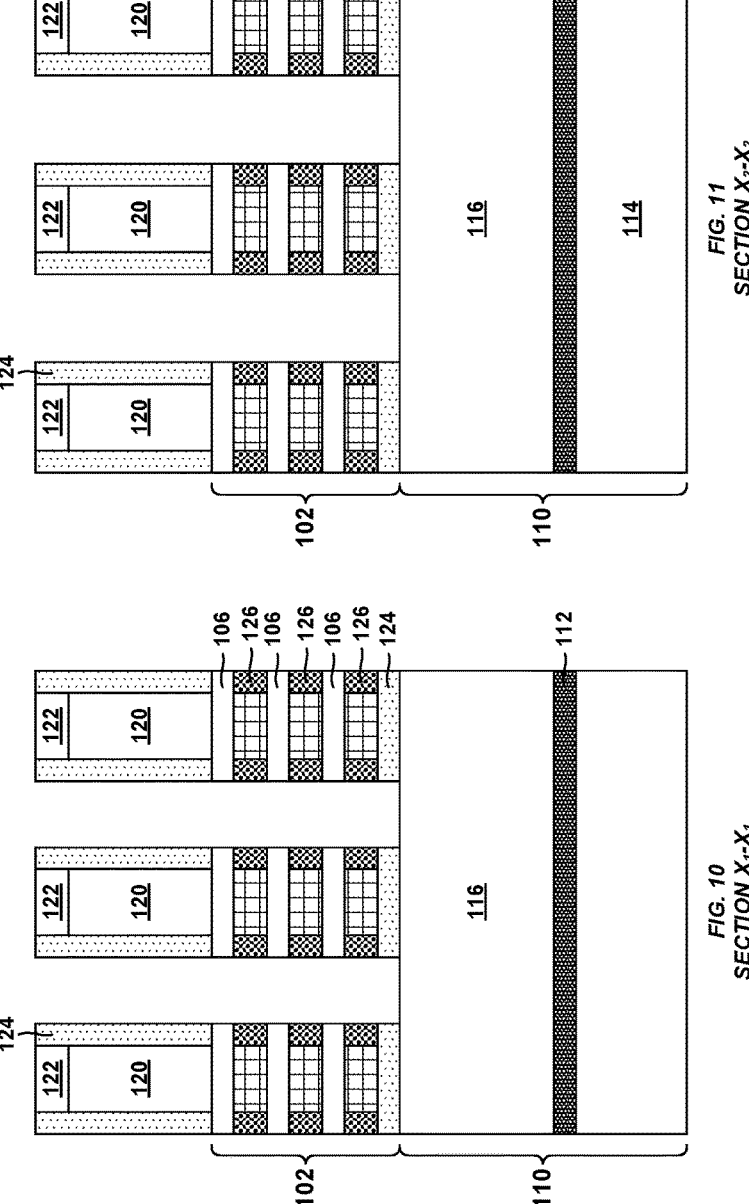

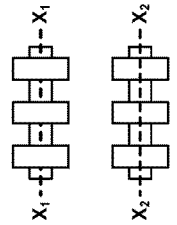
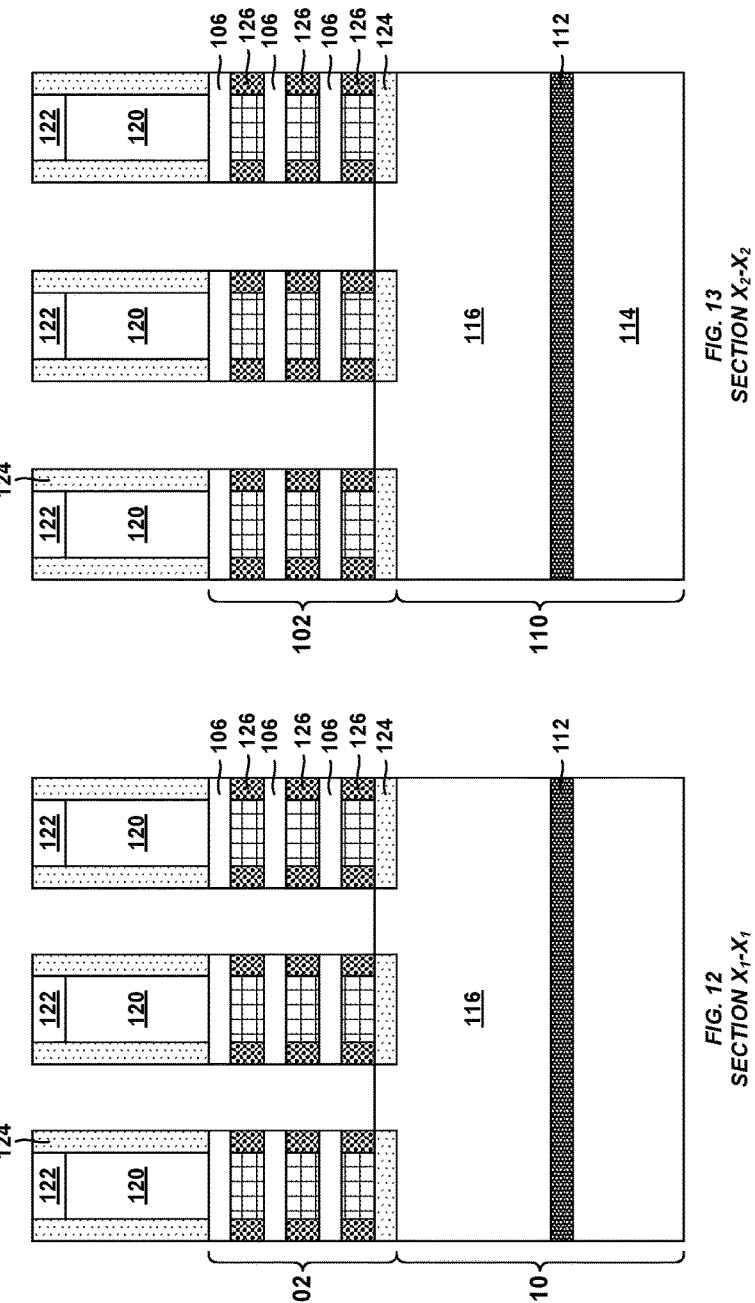

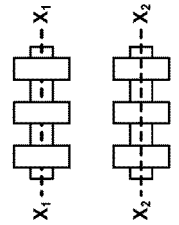
100
1st Array
2nd Array
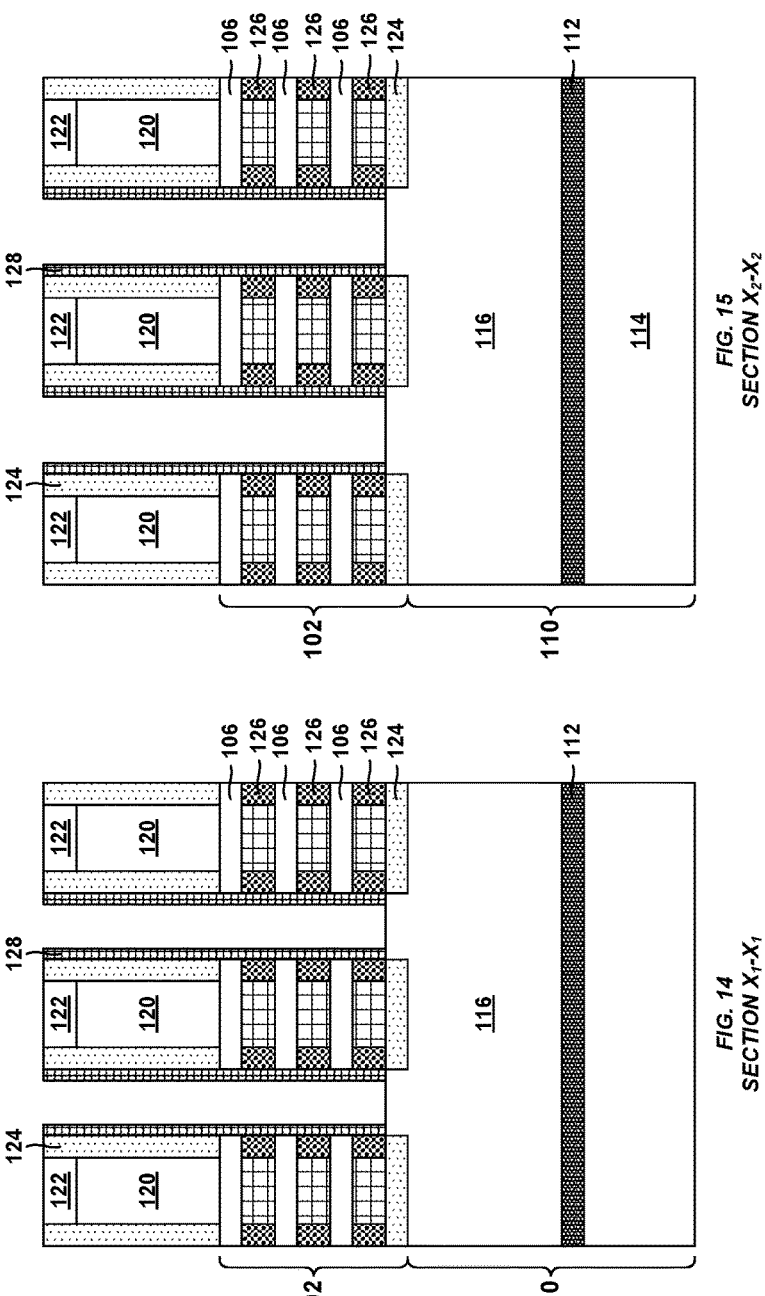
*FIG. 14*
*SECTION X₁-X₁*
*FIG. 15*
*SECTION X₂-X₂*

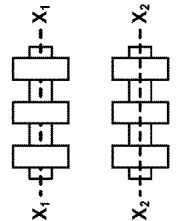
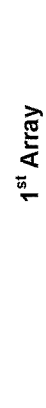
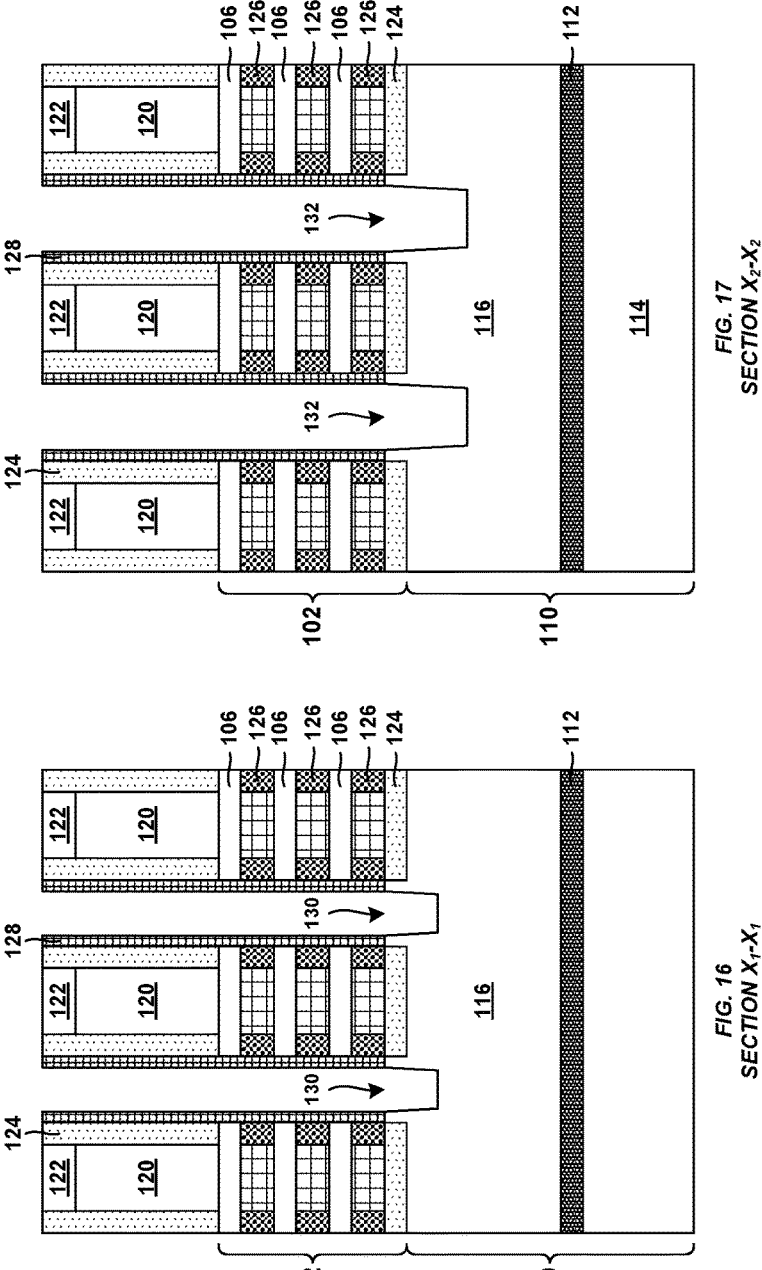
FIG. 16
SECTION X₁-X₁
FIG. 17
SECTION X₂-X₂
1ˢᵗ Array
2ⁿᵈ Array

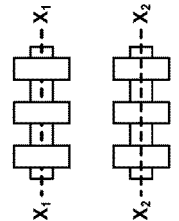
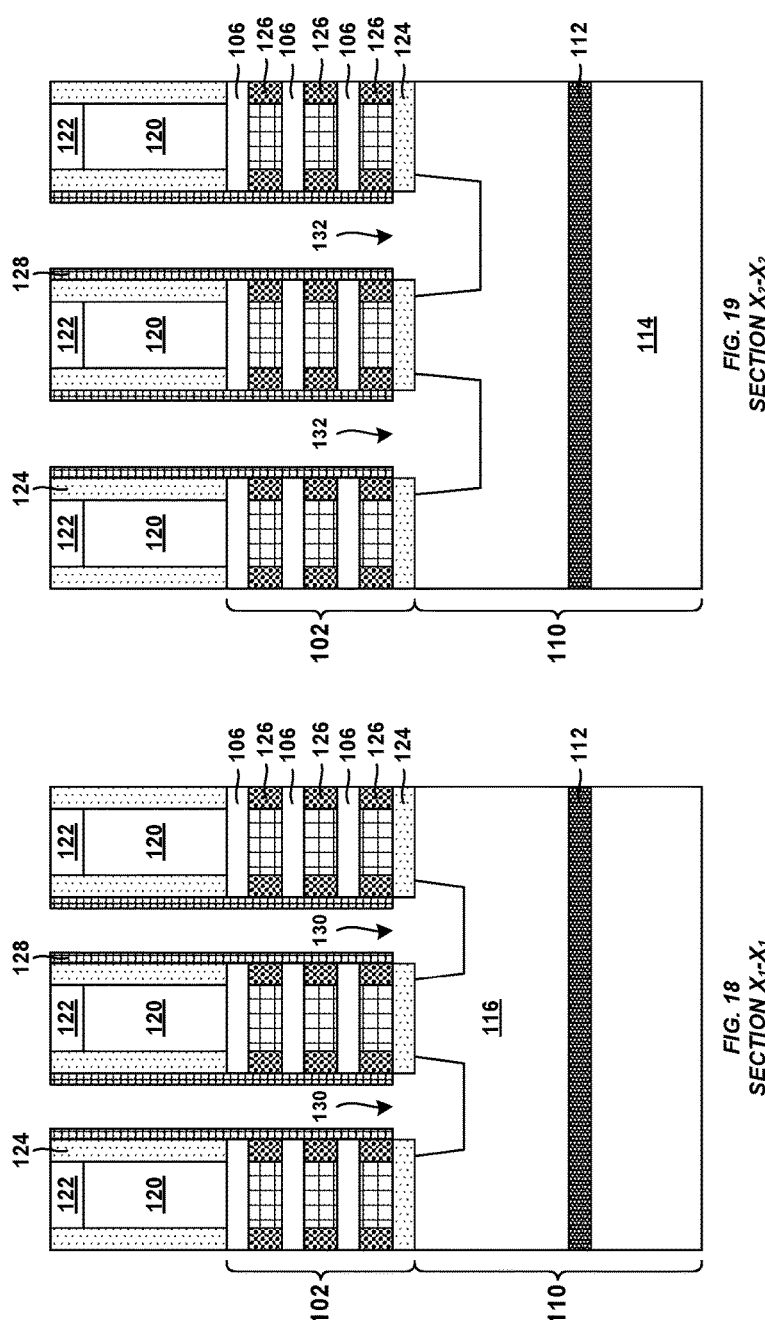
FIG. 18
SECTION X₁-X₁
FIG. 19
SECTION X₂-X₂

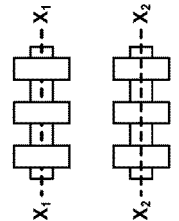
1st Array
2nd Array
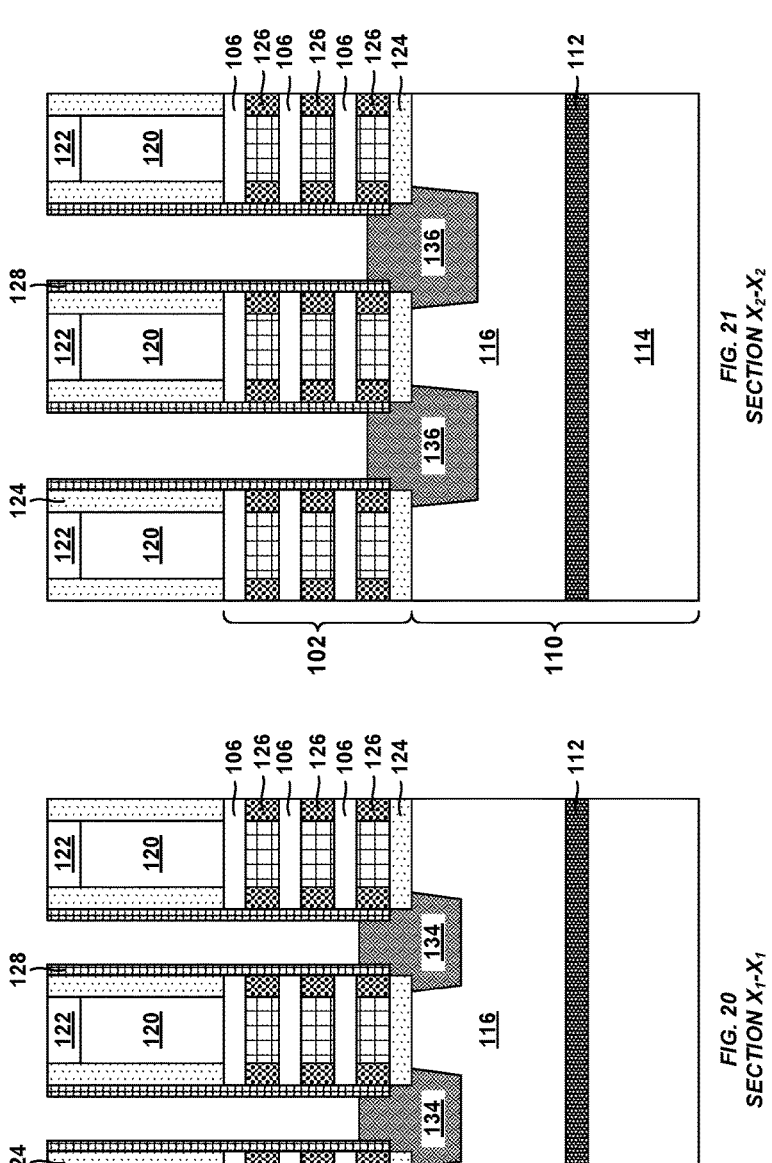
FIG. 20
SECTION $X_1$-$X_1$
FIG. 21
SECTION $X_2$-$X_2$

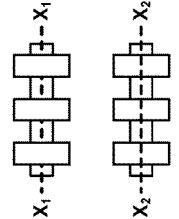
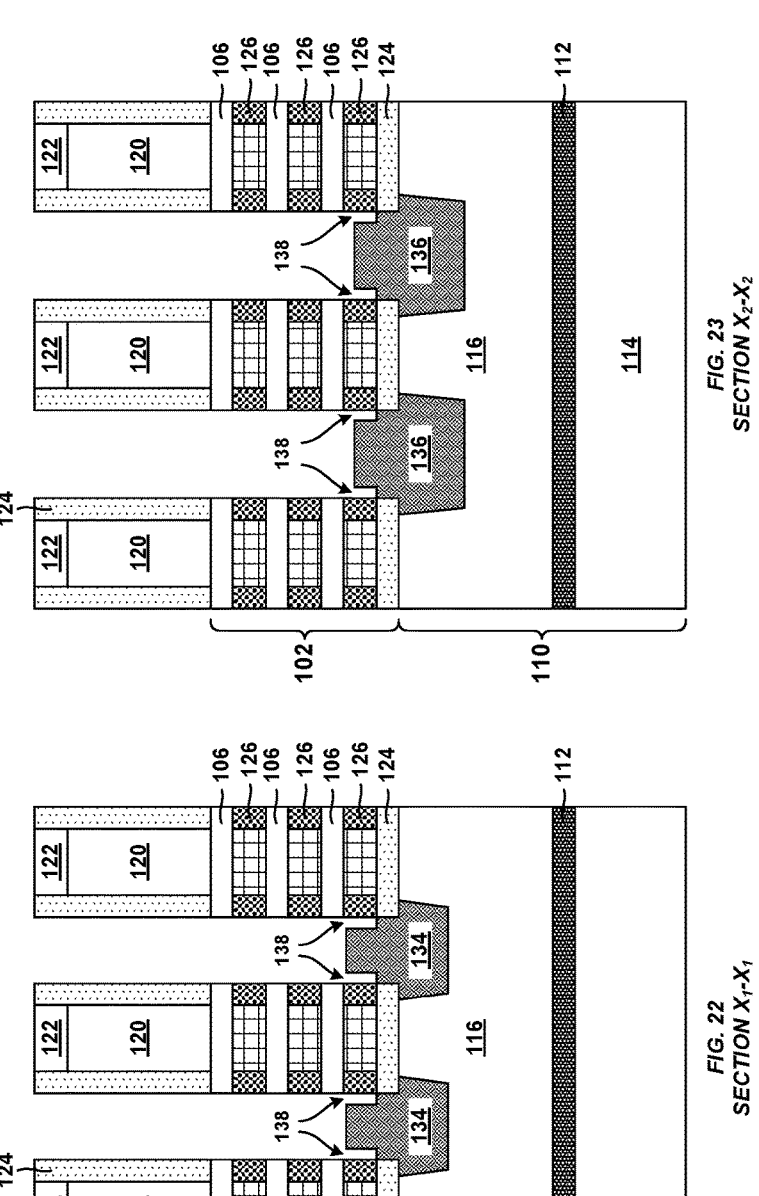
100
1st Array
2nd Array
FIG. 22
SECTION X₁-X₁
FIG. 23
SECTION X₂-X₂

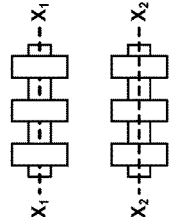
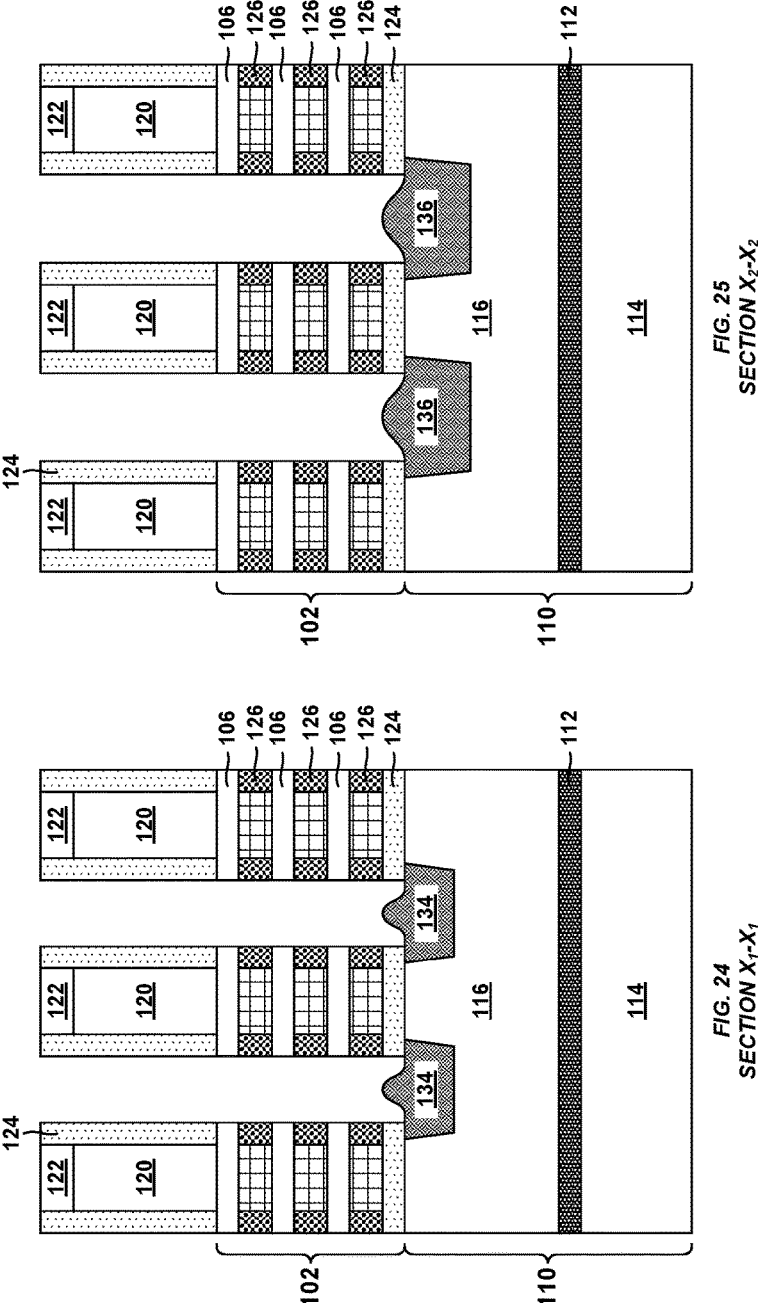
FIG. 24
SECTION X₁-X₁
FIG. 25
SECTION X₂-X₂

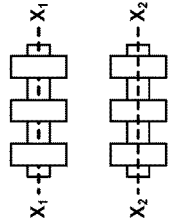
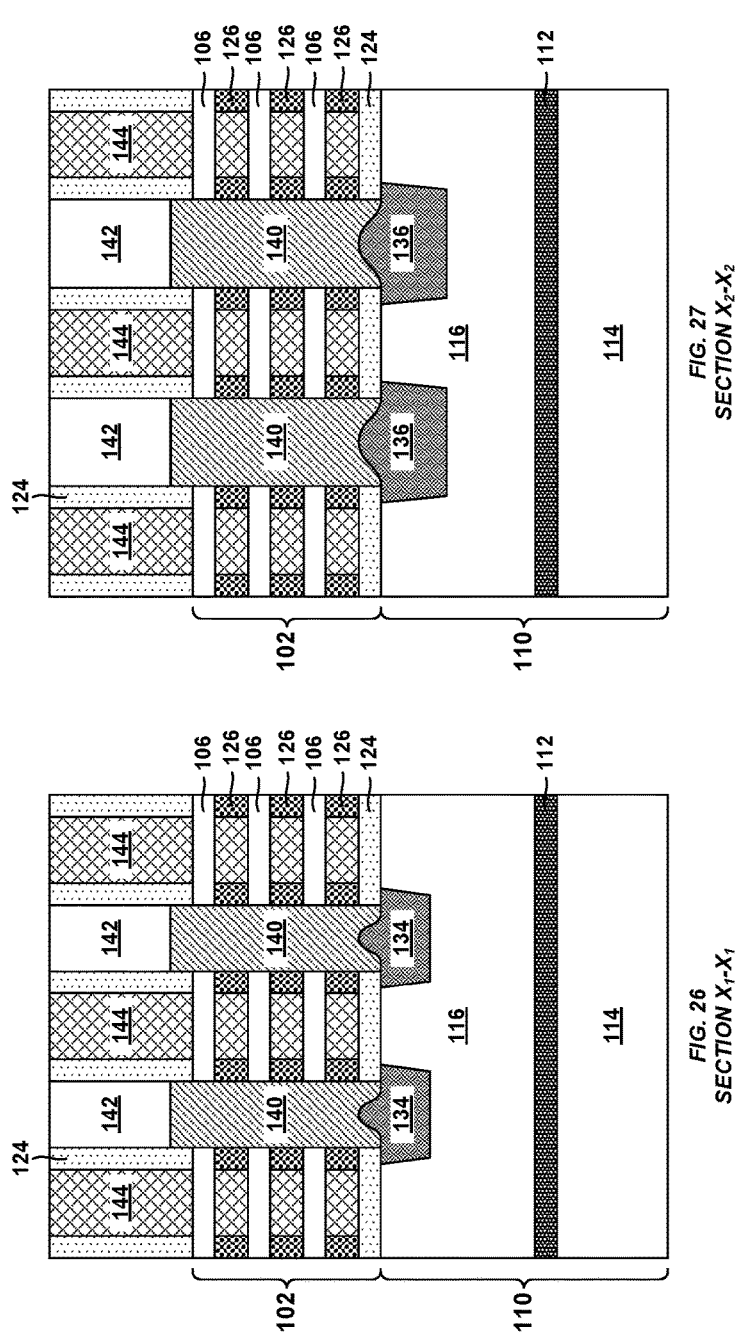
FIG. 27
SECTION X₂-X₂
FIG. 26
SECTION X₁-X₁

100

SECTION X₁-X₁

150

148

142

144    144    144

146

140    140

134    134

116

102

106 126 106 126 106 126 124

112

110    114

SECTION X₂-X₂

150

148

142

144    144    144

146

140    140

136    136

116

102

106 126 106 126 106 126 124

112

114

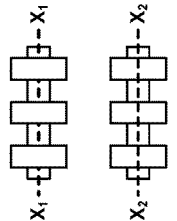
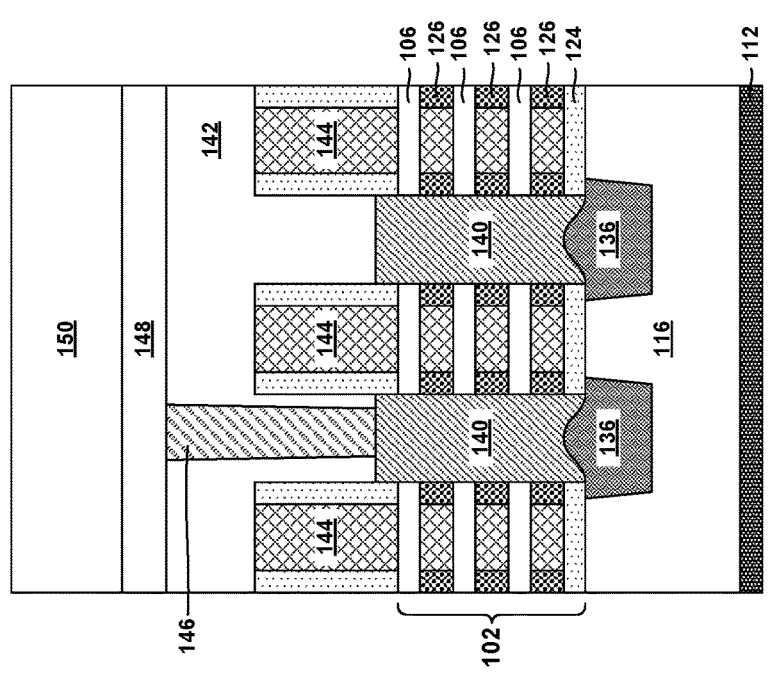
FIG. 31
SECTION X₂-X₂
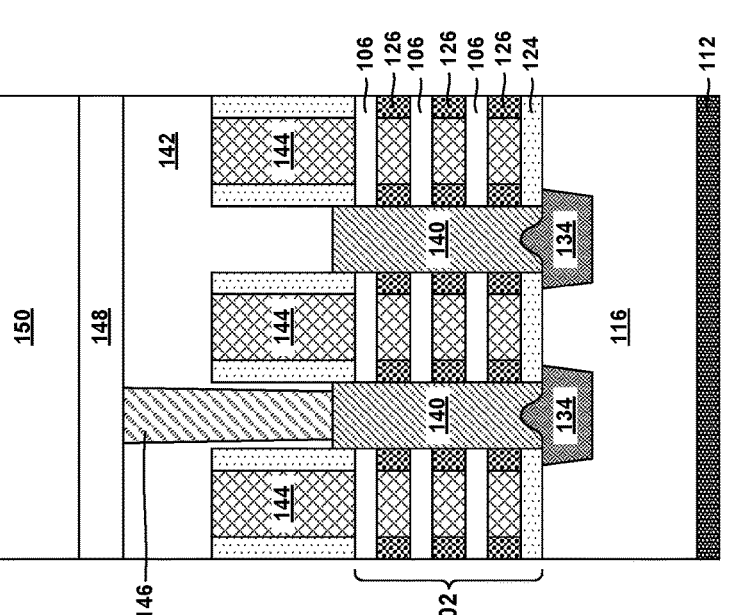
FIG. 30
SECTION X₁-X₁

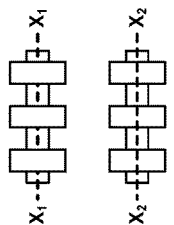
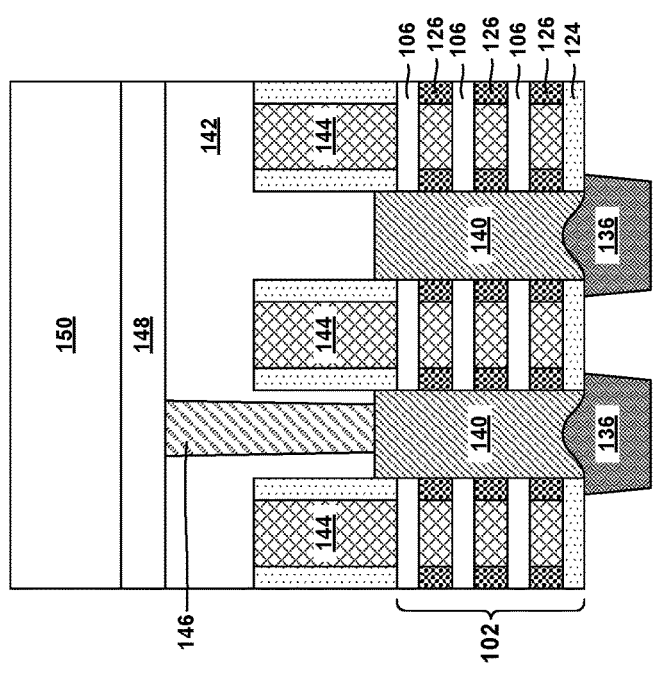
FIG. 33
SECTION X₂-X₂
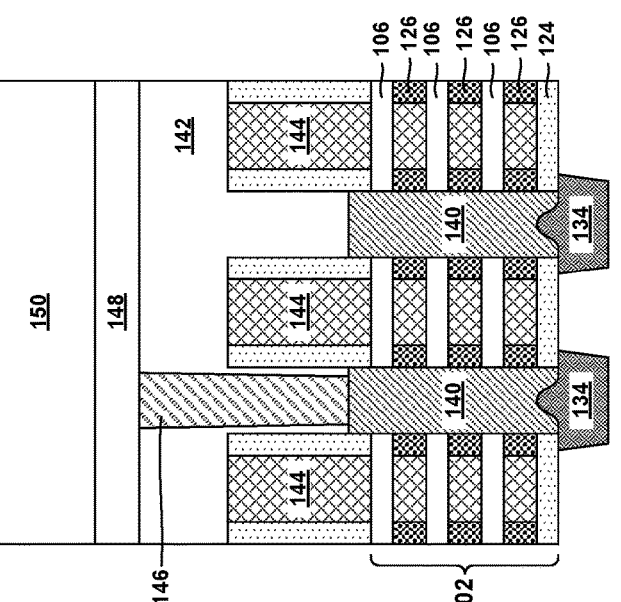
FIG. 32
SECTION X₁-X₁

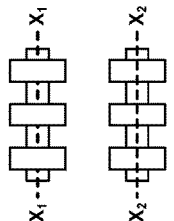
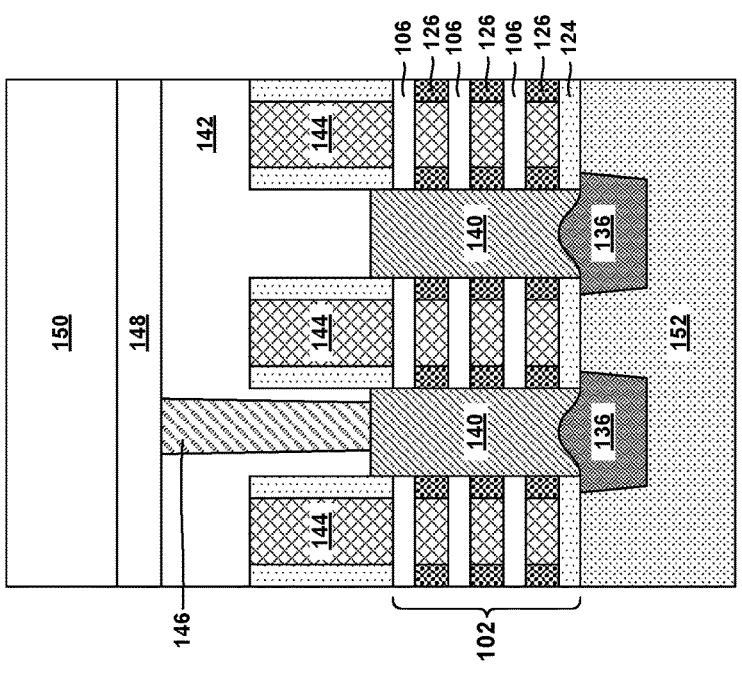
*FIG. 35*
*SECTION X₂-X₂*
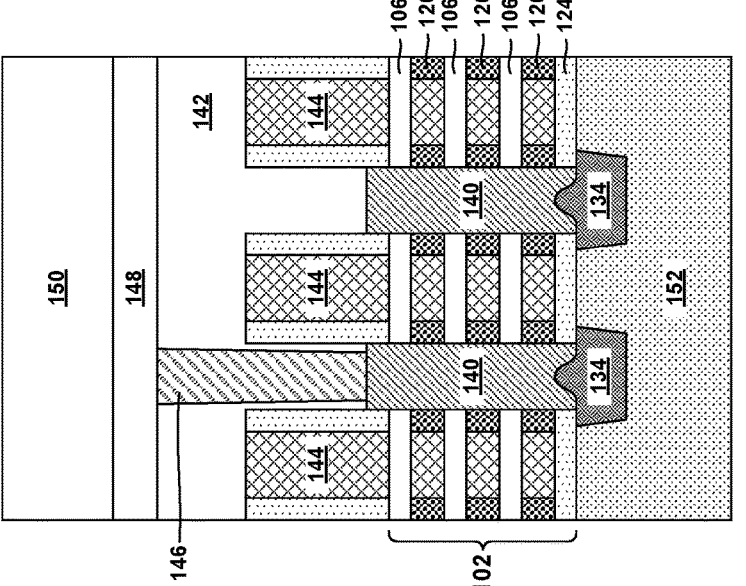
*FIG. 34*
*SECTION X₁-X₁*

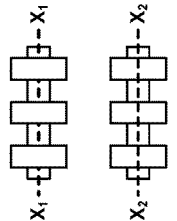
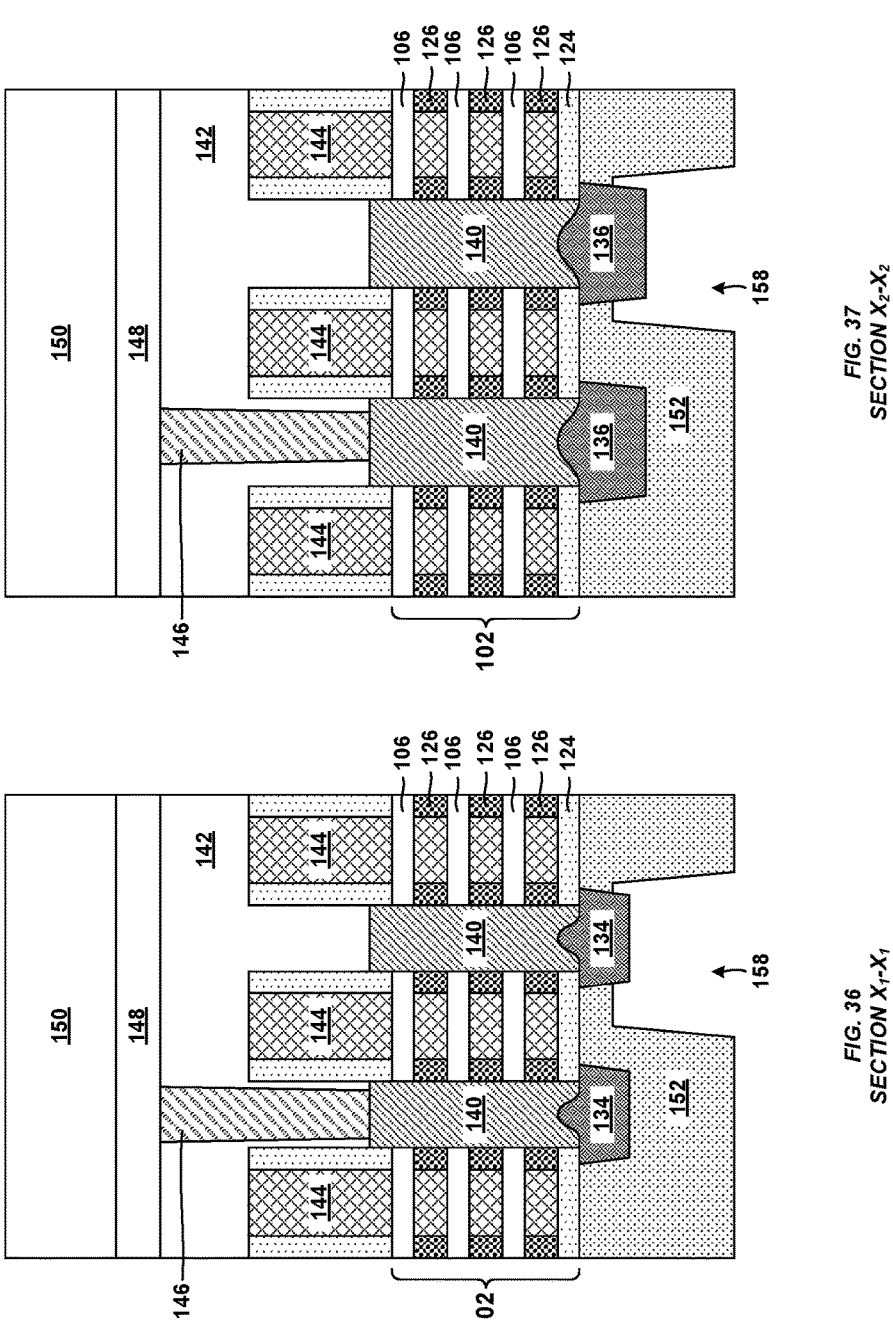
FIG. 37
SECTION X₂-X₂
FIG. 36
SECTION X₁-X₁

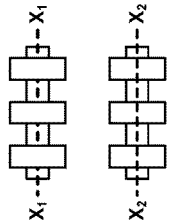
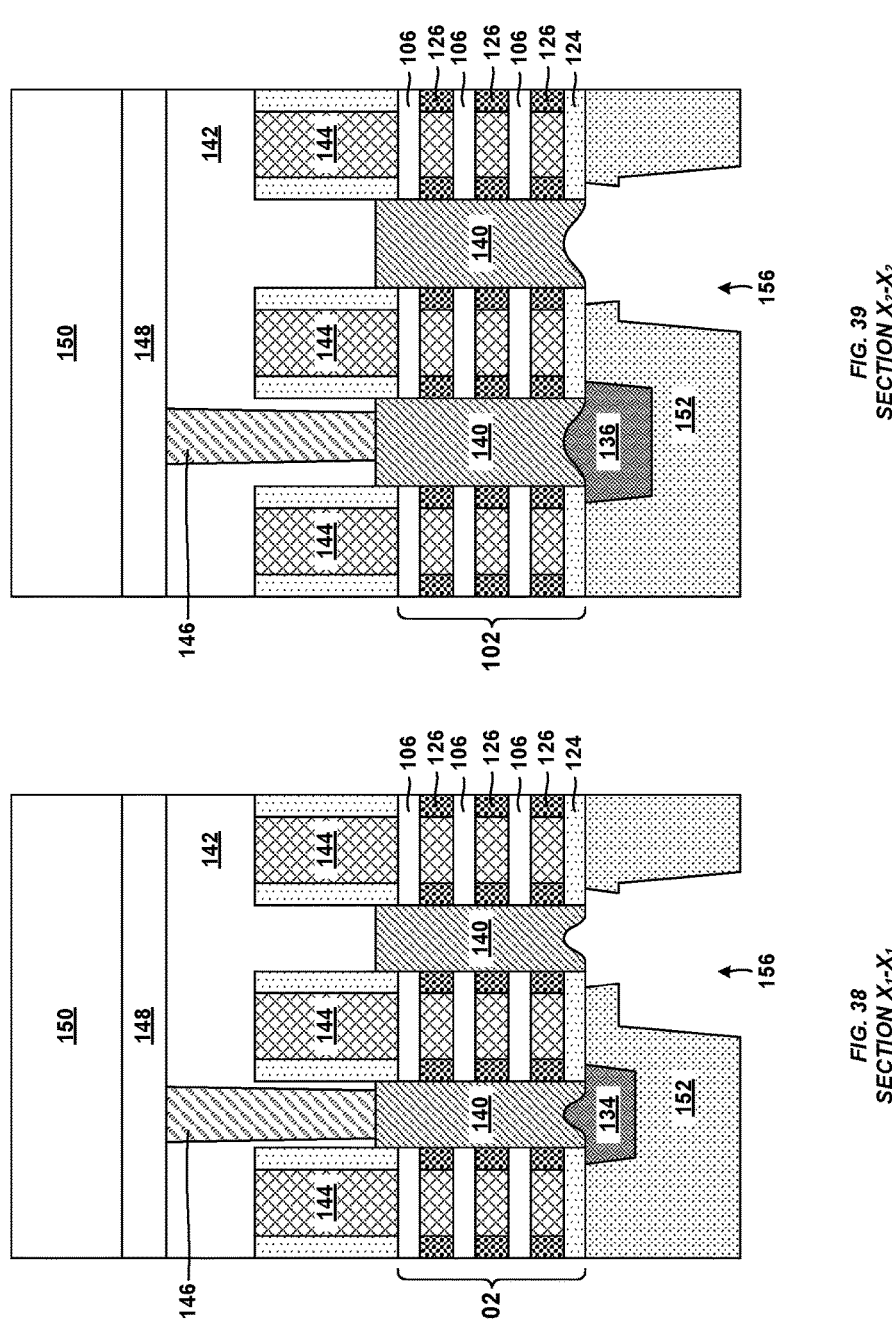
FIG. 38
SECTION X₁-X₁
FIG. 39
SECTION X₂-X₂

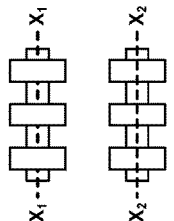
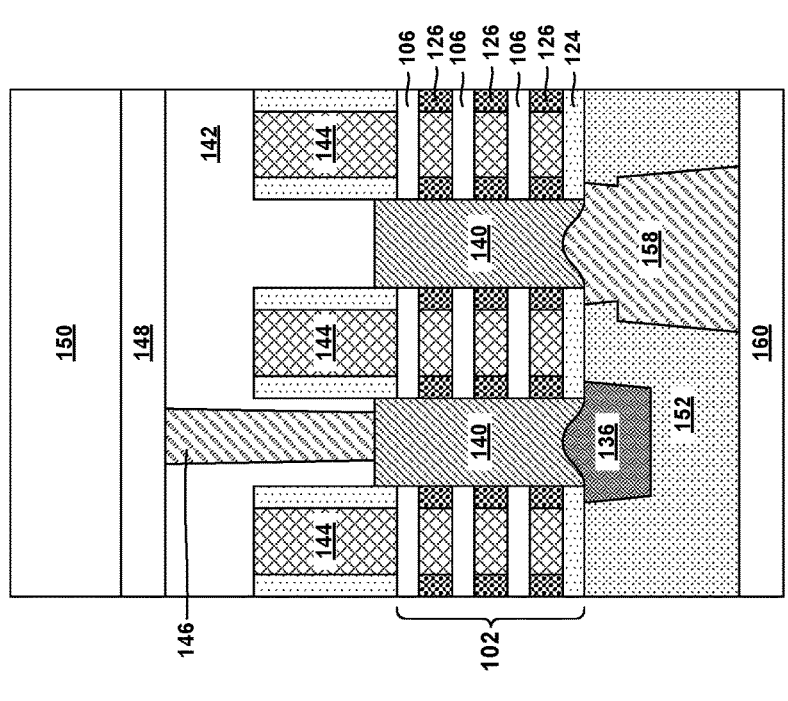
*FIG. 41*
*SECTION X₂-X₂*
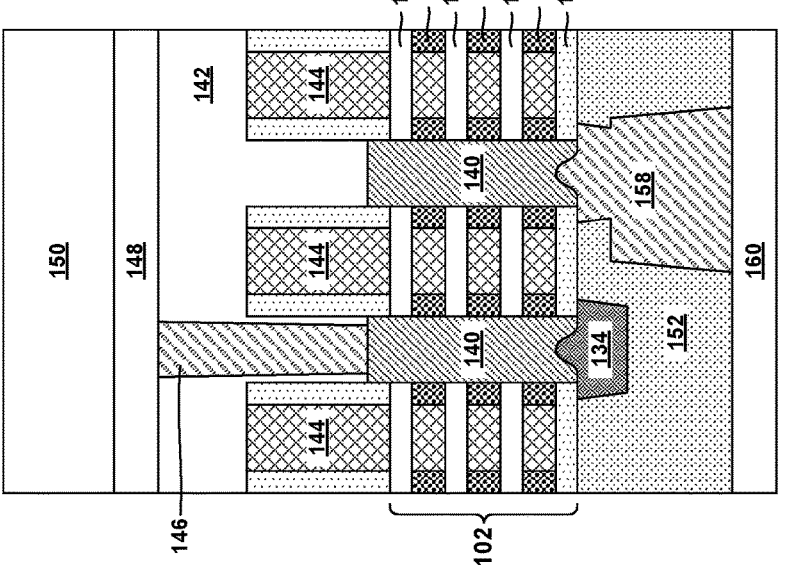
*FIG. 40*
*SECTION X₁-X₁*

SELF-ALIGNED BACKSIDE CONTACT

BACKGROUND

The present invention generally relates to semiconductor structures, and more particularly to nanosheet transistor structures having self-aligned backside contacts.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of stacked nanosheets extending between a pair of source drain epitaxial regions. The device may be a gate-all-around device or transistor in which the gate surrounds a portion of the nanosheet channel. A nanosheet device contains one or more layers of semiconductor channel material portions having a vertical thickness that is substantially less than its width.

SUMMARY

According to an embodiment of the present invention, a semiconductor structure is provided. The semiconductor structure may include a first transistor comprising a first placeholder and a first gate pitch, and a second transistor comprising a second placeholder and a second gate pitch, where the first gate pitch is less than the second gate pitch, and wherein the first placeholder is smaller than the second placeholder.

According to another embodiment of the present invention, a semiconductor structure is provided. The semiconductor structure may include a first array of nanosheet transistors comprising first placeholders, and a second array of nanosheet transistors comprising second placeholders, where a first gate pitch of the first array of nanosheet transistors is less than a second gate pitch of the second array of nanosheet transistors, and where a bottommost surface of each of the second placeholders is below a bottommost surface of each of the first placeholders.

According to another embodiment of the present invention, a semiconductor structure is provided. The semiconductor structure may include a first array of nanosheet transistors comprising first placeholders adjacent to first backside source drain contacts, wherein the first array of nanosheet transistors comprises a first gate pitch, and a second array of nanosheet transistors second placeholders adjacent to second backside source drain contacts, wherein the first array of nanosheet transistors comprises a second gate pitch, where the first gate pitch is less than the second gate pitch, and where a bottommost surface of each of the second placeholders is below a bottommost surface of each of the first placeholders.

BRIEF DESCRIPTION OF THE DRAWINGS

The following detailed description, given by way of example and not intended to limit the invention solely thereto, will best be appreciated in conjunction with the accompanying drawings, in which:

FIGS. 2 and 3 are cross-sectional views of the semiconductor structure during an intermediate step of a method of fabricating nanosheet transistor structures according to an exemplary embodiment;

FIGS. 4 and 5 are cross-sectional views of the semiconductor structure after forming and patterning a sacrificial gate dielectric and sacrificial gates according to an exemplary embodiment;

FIGS. 6 and 7 are cross-sectional views of the semiconductor structure after selectively removing the second sacrificial nanosheets according to an exemplary embodiment;

FIGS. 8 and 9 are cross-sectional views of the semiconductor structure after forming a spacer material according to an exemplary embodiment;

FIGS. 10 and 11 are cross-sectional views of the semiconductor structure after removing portions of the nanosheet stacks according to an exemplary embodiment;

FIGS. 12 and 13 are cross-sectional views of the semiconductor structure after adding substrate material according to an exemplary embodiment;

FIGS. 14 and 15 are cross-sectional views of the semiconductor structure after sacrificial spacers according to an exemplary embodiment;

FIGS. 16 and 17 are cross-sectional views of the semiconductor structure after forming first openings and second openings according to an exemplary embodiment;

FIGS. 18 and 19 are cross-sectional views of the semiconductor structure after enlarging the openings according to an exemplary embodiment;

FIGS. 20 and 21 are cross-sectional views of the semiconductor structure after forming first placeholders and second placeholders according to an exemplary embodiment;

FIGS. 22 and 23 are cross-sectional views of the semiconductor structure after removing the sacrificial spacers according to an exemplary embodiment;

FIGS. 24 and 25 are cross-sectional views of the semiconductor structure after recessing the first placeholders and the second placeholders according to an exemplary embodiment;

FIGS. 26 and 27 are cross-sectional views of the semiconductor structure after forming source drain regions, a dielectric layer, selectively removing the sacrificial gates and the first sacrificial nanosheets, and forming gate structures according to an exemplary embodiment;

FIGS. 30 and 31 are cross-sectional views of the semiconductor structure after flipping the assembly and recessing the substrate according to an exemplary embodiment;

FIGS. 32 and 33 are cross-sectional views of the semiconductor structure after removing remaining portions of the substrate according to an exemplary embodiment;

FIGS. 34 and 35 are cross-sectional views of the semiconductor structure after forming a backside dielectric layer according to an exemplary embodiment;

FIGS. 36 and 37 are cross-sectional views of the semiconductor structure after forming backside contact trenches according to an exemplary embodiment;

FIGS. 38 and 39 are cross-sectional views of the semiconductor structure after removing the placeholders according to an exemplary embodiment; and FIGS. 40 and 41 are cross-sectional views of the semiconductor structure after forming backside contact structures and backside wiring layers according to an exemplary embodiment.

Figure 1:
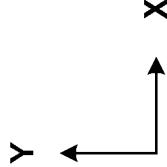
FIG. 1, a top view of a generic structure is shown to provide spatial context to the different cross-sectional views and structural orientations of the semiconductor structures shown in the subsequent figures.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary field effect transistors, including gate-all-around transistor devices and nanosheet transistor devices, have known advantages over conventional transistor structures in terms of density, performance, power consumption, and integration. However, fabricating device contacts on a backside of the wafer presents unique challenges. More specifically, for example, conventional placeholder fabrication techniques introduce undesirable process variations when fabricating transistor arrays with different gate pitch. Such process variations could result in insufficient source/drain growth near bottom channels. Therefore, it is desired to form self-aligned backside contacts using placeholders without need the undesirable process variations.

The present invention generally relates to semiconductor structures, and more particularly to nanosheet transistor structures having self-aligned backside contacts. More specifically, the nanosheet transistor structures and associated method disclosed herein enable a novel solution for providing self-aligned backside device contacts using placeholder fabrication techniques and avoiding the undesirable process variations. Exemplary embodiments of nanosheet transistor structures having self-aligned backside contacts are described in detail below by referring to the accompanying drawings in FIGS. 1 to 41. Those skilled in the art will readily appreciate that the detailed description given herein with respect to these figures is for explanatory purposes as the invention extends beyond these limited embodiments.

Referring now to FIG. 1, a top view of a generic structure is shown to provide spatial context to the different cross-sectional views and structural orientations of the semiconductor structures shown in the figures and described below. Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

The generic structure illustrated in FIG. 1 shows a first transistor array and a second transistor array including fins/stacks and corresponding gate regions situated perpendicular to the fins/stacks. FIGS. 1-41 represent cross section views oriented as indicated in FIG. 1

Referring now to FIGS. 2 and 3, a structure 100 is shown during an intermediate step of a method of fabricating a stacked transistor structure according to an embodiment of the invention. FIG. 2 depicts a cross-sectional view of the structure 100 taken along line $X_1$-$X_1$, and FIG. 3 depicts a cross-sectional view of the structure 100 taken along line $X_2$-$X_2$.

The structure 100 illustrated in FIGS. 2-3 includes nanosheet stacks 102, or fins, formed from an alternating series of first silicon germanium (SiGe) sacrificial nanosheets 104 (hereinafter "first sacrificial nanosheets 104"), silicon (Si) channel nanosheets 106 (hereinafter "channel nanosheets 106"), and second silicon germanium (SiGe) sacrificial nanosheets 108 (hereinafter "second sacrificial nanosheets 108"), as illustrated. The nanosheet stacks 102 are formed on a silicon substrate 110. Although only a limited number of nanosheet stacks 102 and nanosheet layers are shown, one or more additional nanosheet stacks and/or nanosheets can optionally be epitaxially grown in an alternating fashion, and the properties of any additional nanosheets are the same as the corresponding nanosheets described herein.

According to embodiments of the present disclosure, the first sacrificial nanosheets 104 have a different germanium concentration than the second sacrificial nanosheets 108. In at least one embodiment, the second sacrificial nanosheets 108 have a higher germanium concentration than the first sacrificial nanosheets 104. More specifically, for example, the second sacrificial nanosheets 108 may have a germanium concentration ranging from about 45 to about 70 percent, while the first sacrificial nanosheets 104 may have a germanium concentration ranging from about 15 to about 40 percent. In all cases, the different germanium concentrations are designed to allow for each of the first sacrificial nanosheets 104 and the second sacrificial nanosheets 108 to be etched selective to one another. As such, other germanium concentrations are explicitly contemplated.

In one or more embodiments, the nanosheet stacks 102 are formed by epitaxially growing one layer and then the next until a desired number and a desired thickness of each layer is achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si: C) can be undoped or can be doped during deposition (in-situ doped) by adding dopants, n-type dopants (e.g., phosphorus or arsenic) or p-type dopants (e.g., boron or gallium), depending on the type of transistor. For example, in at least one embodiment, each nanosheet stack 102 includes channel nanosheets 106 which are doped, undoped or some combination thereof.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The substrate 110 may be a layered semiconductor such as a silicon-on-insulator or SiGe-on-insulator, where an etch stop layer 112, separates a base substrate 114 from a top semiconductor layer 116. Unlike conventional layered semiconductor substrates, the etch stop layer 112 of the substrate 110 may include any material which affects the desired etch selectivity during subsequent processing. For example, the etch stop layer 112 may be a conventional buried oxide layer, or it may be a silicon germanium layer with a specific germanium concentration. In practice, the etch stop layer 112 will function as an etch stop layer and can be composed of any material which supports that function.

In the present embodiment, both the base substrate 114 and the top semiconductor layer 116 may be any bulk substrate made from any of several known semiconductor materials such as, for example, silicon, germanium, silicon-germanium alloy, and compound (e.g. III-V and II-VI) semiconductor materials. For example, both the base substrate 114 and the top semiconductor layer 116 may be made from silicon. Additionally, both the etch stop layer 112 and the base substrate 114 are sacrificial and will not remain in the final structure.

Known processing techniques have been applied to the alternating layers to form the nanosheet stacks 102 shown. For example, the known processing techniques can include the formation of hard masks (not shown) over the topmost layer of the nanosheet stacks 102. The hard masks can be formed by first depositing the hard mask material (for example silicon nitride) onto the topmost layer of the nanosheet stack 102 using, for example, chemical vapor deposition (CVD), plasma enhanced CVD (PECVD) or any suitable technique for dielectric deposition that does not induce a physical or chemical change to the topmost layer of the nanosheet stack 102. According to an exemplary embodiment, the hard mask material is deposited onto the channel nanosheets 106 at the top of the nanosheet stack 102 and then patterned into a plurality of the individual hard masks. Patterning the hard mask is commensurate with a desired footprint and location of the nanosheet stacks 102 shown in FIG. 4, which will subsequently be used to form the channel regions of semiconductor devices disclosed herein. According to an exemplary embodiment, RIE is used to transfer the hard mask pattern into the alternating layers to form the nanosheet stacks 102, and into the substrate 110, as shown.

Next, shallow trench isolation regions (not shown) are formed according to known techniques. The shallow trench isolation regions are formed at the bottom of trenches in the substrate 110 formed during patterning of the nanosheet stacks 102. Specifically, a dielectric material is deposited at the bottom of trenches in the substrate 110 to isolate adjacent devices from one another according to known techniques. The shallow trench isolation regions may be formed from any appropriate dielectric material including, for example, silicon oxide ($SiO_x$) or silicon nitride ($Si_xN_y$).

Referring now to FIGS. 4 and 5, the structure 100 is shown after forming and patterning a sacrificial gate dielectric (not shown) and sacrificial gates 120 according to an embodiment of the invention. FIG. 4 depicts a cross-sectional view of the structure 100 taken along line $X_1$-$X_1$, and FIG. 5 depicts a cross-sectional view of the structure 100 taken along line $X_2$-$X_2$.

The sacrificial gate dielectric is deposited directly on exposed surfaces of the structure 100 according to known techniques. Specifically, for example, a relatively thin layer of silicon oxide (SiO2) is first conformally deposited over and around the nanosheet stacks 102, as illustrated.

A sacrificial gate material is first are blanket deposited over and around the nanosheet stacks 102 according to known techniques. Specifically, for example, a relatively thick layer of amorphous silicon is blanket deposited directly on the sacrificial gate dielectric, as illustrated. In this manner, both the sacrificial gate dielectric and the sacrificial gate material completely covers the nanosheet stacks 102.

As used herein, "conformal" it is meant that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

Next, a gate hard mask 122 is formed over the structure 100. The gate hard mask 122 defines gate regions of individual devices. According to an exemplary embodiment, a mask material is deposited onto the sacrificial gate material and then patterned into a plurality of individual gate hard masks 122. Next, the pattern created by the individual gate hard masks 122 is transferred into the sacrificial gate dielectric and the sacrificial gate material. Specifically, portions of sacrificial gate dielectric and the sacrificial gate material are etched or removed selective to the gate hard mask 122 to form the sacrificial gates 120, as illustrated. The portions of the sacrificial gate dielectric and the sacrificial gate material can be removed using a silicon RIE process.

Critical to embodiments of the present invention, a first gate pitch (P1) of the first transistor array is different from a second gate pitch (P2) of the second transistor array. As depicted in the figured, the first gate pitch (P1) is less than the second gate pitch (P2).

Referring now to FIGS. 6 and 7, the structure 100 is shown after selectively removing the second sacrificial nanosheets 108 according to an embodiment of the invention. FIG. 6 depicts a cross-sectional view of the structure 100 taken along line $X_1$-$X_1$, and FIG. 7 depicts a cross-sectional view of the structure 100 taken along line $X_2$-$X_2$.

More specifically, the second sacrificial nanosheets 108 are etched and removed selective to the first sacrificial nanosheets 104 and/or the channel nanosheets 106 according to known techniques. Doing so is made possible by the different concentrations of germanium. In this case, the layers with the relatively higher germanium concentration are removed selective to layers with the relatively lower germanium concentrations.

Referring now to FIGS. 8 and 9 the structure 100 is shown after forming a spacer material 124 according to an embodiment of the invention. FIG. 8 depicts a cross-sectional view of the structure 100 taken along line $X_1$-$X_1$, and FIG. 9 depicts a cross-sectional view of the structure 100 taken along line $X_2$-$X_2$.

The spacer material 124 is deposited directly on exposed surfaces of the structure 100 according to known techniques. Specifically, for example, a relatively thin layer of silicon nitride is conformally deposited as illustrated. In some embodiments, for example, the spacer material 124 may be composed of SiN, SiBCN, SiOCN, SiOC, or any other combination of low-k materials. The term "low-k" as used throughout the present application denotes a dielectric material that has a dielectric constant of less than 4.0. According to embodiments of the present disclosure, the spacer material 124 substantially fills the space created by removing the second sacrificial nanosheets 108, and functions to isolate the nanosheet stacks 102 from the substrate 110. Further, according to embodiments of the present disclosure, the spacer material 124 substantially covers exposed vertical sidewalls of the nanosheet stacks 102 and exposed vertical sidewalls of the sacrificial gate 120, as illustrated in FIG. 13.

Referring now to FIGS. 10 and 11, the structure 100 is shown after removing portions of the nanosheet stacks 102 according to an embodiment of the invention. FIG. 10 depicts a cross-sectional view of the structure 100 taken along line $X_1$-$X_1$, and FIG. 11 depicts a cross-sectional view of the structure 100 taken along line $X_2$-$X_2$.

Portions of the nanosheet stacks 102 are etched and removed from between the sacrificial gates 120 according to known techniques. Specifically, the pattern created by the individual gate hard masks 122 and the spacer material 124 is transferred into the nanosheet stacks 102. In doing so, portions of the first sacrificial nanosheets 104, and the channel nanosheets 106, are removed selective to the spacer material 124, as illustrated.

In an embodiment, portions of the nanosheet stacks 102 are removed using an anisotropic etch such as, for example, reactive ion etching. Doing so may require a series of multiple etching steps using different etch chemistries as is well known in the art. Etching is designed to create source drain openings and expose ends of individual nanosheet layers.

Next, exposed portions of the spacer material 124 at the bottom of the source drain openings are selectively removed according to known techniques. Specifically, in an embodiment, exposed portions of the spacer material 124 are removed using an anisotropic etch such as, for example, reactive ion etching. Doing so will expose the substrate 110, as illustrated.

With continued reference to FIGS. 10 and 11, the structure 100 is shown after forming inner spacers 126 according to an embodiment of the invention.

First, the first sacrificial nanosheets 104 are laterally recessed to make room for the inner spacers 126. In one or more embodiments, the first sacrificial nanosheets 104 are laterally recessed using a hydrogen chloride (HCl) gas isotropic etch process, which etches silicon germanium without attacking silicon. In other embodiments, the first sacrificial nanosheets 104 are laterally recessed using a CIF3 etch process. Cavities (not shown) are formed by spaces that were occupied by the removed portions of the first sacrificial nanosheets 104.

The inner spacers 126 are formed by first conformally depositing a spacer material over the structure 100 to fill the cavities created by laterally recessing the first sacrificial nanosheets 104. The conformal spacer material is then isotropically etched to remove all portions except those remaining in the cavities and forming the inner spacers 126.

In one or more embodiments, the inner spacers 126 are made from a nitride containing material, for example silicon nitride (SiN). Although inner spacers 126 shown in FIGS. 10 and 11 are formed from a nitride containing material, they can be formed from any material for which subsequent device fabrication operations are not very selective. Selectivity, as used in the present description, refers to the tendency of a process operation to impact a particular material. One example of low selectivity is a relatively slow etch rate. One example of a higher or greater selectivity is a relatively faster etch rate. For the described embodiments, a material for the inner spacers 126 can be selected based on a selectivity of subsequent device fabrication operations for the selected material being below a predetermined threshold.

The inner spacers 126 are positioned such that subsequent etching processes used to remove the first sacrificial nanosheets 104 during device fabrication do not also attack subsequently formed source drain regions.

Referring now to FIGS. 12 and 13, the structure 100 is shown after adding substrate material according to an embodiment of the invention. FIG. 12 depicts a cross-sectional view of the structure 100 taken along line $X_1$-$X_1$, and FIG. 13 depicts a cross-sectional view of the structure 100 taken along line $X_2$-$X_2$.

Additional substrate material is added to the top semiconductor layer 116 according to known techniques. Specifically, additional silicon-based material is epitaxially grown from top surfaces of the top semiconductor layer 116 exposed within the source drain openings. In all cases, the additional silicon-based materials are grown with a target thickness substantially equal to a thickness of the spacer material 124, as illustrated. Although the exact thickness of the additional silicon-based materials is not critical, a top surface of the additional silicon-based materials should never extend above top surfaces of the bottommost inner spacers 126. Said differently, the additional silicon-based materials should preferably not touch, cover, or otherwise block the bottommost channel nanosheet 106. According to embodiments of the present invention, the silicon-based material may be identical or substantially identical to the material of the top semiconductor layer 116. For example, in at least one embodiment, both the top semiconductor layer 116 and the additional silicon-based material are silicon.

Referring now to FIGS. 14 and 15, the structure 100 is shown after forming sacrificial spacers 128 according to an embodiment of the invention. FIG. 14 depicts a cross-sectional view of the structure 100 taken along line $X_1$-$X_1$, and FIG. 15 depicts a cross-sectional view of the structure 100 taken along line $X_2$-$X_2$.

The sacrificial spacers 128 are formed directly on exposed vertical sidewalls of the source drain openings according to known techniques. Specifically, for example, a relatively thin spacer material is conformally deposited over and around the nanosheet stacks 102, the sacrificial gates 120, and the spacer material 124, followed by directional RIE of the deposited spacer material. The remaining portions of the spacer material form the sacrificial spacers 128 which are necessary to protect and prevent damage to exposed ends of the channel nanosheets 106 during subsequent processing. According to embodiments of the present invention the spacer material may include aluminum oxide or titanium oxide; however, other known spacers materials offering suitable etch selectivity may also be used.

Referring now to FIGS. 16 and 17, the structure 100 is shown after forming first openings 130 and second openings 132 in the substrate 110 according to an embodiment of the invention. FIG. 16 depicts a cross-sectional view of the structure 100 taken along line $X_1$-$X_1$, and FIG. 17 depicts a cross-sectional view of the structure 100 taken along line $X_2$-$X_2$.

The openings 130, 132 are formed in the top semiconductor layer 116 at a bottom of the source drain openings according to known techniques and as illustrated. Specifically, known etching techniques are used to remove portions of the top semiconductor layer 116 selective to the sacrificial spacers 128, the spacer material 124, and the gate hard mask 122, as illustrated. Etching continues until bottom surface of the openings 130, 132 is below the bottom surface of spacer material 124. For example, the bottom surface of the openings 130 and 132 can reach depth of approximately 10 nm to approximately 30 nm below the bottom surface of the spacer material 124, although other depths are explicitly contemplated.

In at least an embodiment, a directional dry etching technique, such as reactive ion etching, is used to etch or remove portions of the top semiconductor layer 116 to form the openings 130, 132. As such, the openings 130, 132 will be self-aligned to the sacrificial spacers 128, as illustrated. Additionally, substrate material remains directly beneath the sacrificial spacers 128 due to the directional nature of the chosen etching technique. As a result of the etching technique used, the openings 130, 132 will have a continuous tapered profile. More specifically, the openings 130, 132 have a cross-sectional dimension which decreases relative to height from top to bottom, as depicted. Although such tapered profiles are conventional, the tapered profile of the openings 130, 132 is substantially uniform or continuous from top to bottom. According to embodiments of the present invention, it is explicitly contemplated that the first openings 130 and the second openings 132 are formed simultaneously during the same processing step using the same etching technique and chemistry.

It is noted, because the first pitch (P1) is less than the second pitch (P2), the corresponding openings 130, 132 will be different sizes. Specifically, the second openings 132 formed in the second transistor array will be wider and deeper than the first openings 130 formed in the first transistor array.

Referring now to FIGS. 18 and 19, the structure 100 is shown after enlarging the openings 130, 132 according to an embodiment of the invention. FIG. 16 depicts a cross-sectional view of the structure 100 taken along line $X_1$-$X_1$, and FIG. 17 depicts a cross-sectional view of the structure 100 taken along line $X_2$-$X_2$.

The openings 130, 132 formed in the top semiconductor layer 116 are further enlarged according to known techniques and as illustrated. Specifically, known etching techniques are used to increase both the width and depth of the openings 130, 132 selective to the sacrificial spacers 128, the spacer material 124, and the gate hard mask 122, as illustrated. Etching continues until sidewalls of the enlarged openings 130, 132 are beneath the bottom surface of the spacer material 124. For example, etching enlarges a lateral width of the openings 130, 132 by approximately 8 nm to approximately 16 nm, as shown; however, other dimensions are explicitly contemplated. Said differently, sidewalls of the enlarged openings 130, 132 may be offset from exposed sidewalls of the spacer material 124 by approximately 4-8 nm on each side of the openings 130, 132.

In at least an embodiment, a non-directional wet etching technique, such as an ammonia based wet etch, is used to further enlarge the openings 130, 132. As such, the openings 130, 132 remain self-aligned to the sacrificial spacers 128 as well as the spacer material 124, as illustrated. As a result of the etching technique used, sidewalls and bottom surfaces of the spacer material 124 will be exposed and the openings 130 will extend laterally beneath the spacer material 124, as illustrated. Further, all remaining substrate material imme-diately beneath the sacrificial spacers 128 is removed due to the non-directional nature of the chosen etching technique. It is critical no substrate material remains immediately beneath the sacrificial spacers 128, otherwise it could be trapped when the openings 130, 132 are subsequently filled with a placeholder material.

It is noted, because the second openings 132 formed in the second transistor array were wider and deeper than the first openings 130 formed in the first transistor array, the same is true after being enlarged. Stated differently, the enlarged second openings 132 formed in the second transistor array will be wider and deeper than the enlarged first openings 130 formed in the first transistor array. The enlarged openings 130, 132 will further maximize contact area between the source drain regions and subsequently formed backside source drain contacts.

Referring now to FIGS. 20 and 21, the structure 100 is shown after forming first placeholders 134 and second placeholders 136 according to an embodiment of the inven-tion. FIG. 20 depicts a cross-sectional view of the structure 100 taken along line $X_1$-$X_1$, and FIG. 21 depicts a cross-sectional view of the structure 100 taken along line $X_2$-$X_2$.

The openings 130, 132 are filled with a sacrificial material to form the placeholders 134, 136 according to known techniques. Specifically, additional silicon-based material is epitaxially grown from surfaces of the top semiconductor layer 116 exposed within the openings 130, 132. In all cases, the additional silicon-based materials are grown with a target thickness sufficient to cover exposed surfaces of the spacer material 124 and extend above bottommost surfaces of the sacrificial spacers 128, as illustrated. Although the exact thickness or height of the additional silicon-based materials is not critical, a top surface of the additional silicon-based materials should generally not extend above the topmost surface of the bottommost channel nanosheet 106.

According to embodiments of the present disclosure, the placeholders 134, 136 are made from a material which can be (a) grown from the top semiconductor layer 116 and (b) removed selective to the top semiconductor layer 116. For example, in at least one embodiment, the placeholders 134, 136 are made from silicon germanium which can be easily grown from the top semiconductor layer 116. Additionally, the germanium concentration allows for the desired etch selectivity It is noted, because the enlarged second openings 132 formed in the second transistor array are wider and deeper than the enlarged first openings 130 formed in the first transistor array, the first placeholders 134 formed in the enlarged second openings 132 are wider and deeper than the second placeholders 136 formed in the enlarged first open-ings 130. Similarly, topmost surfaces of the second place-holders 136 are above topmost surfaces of the first place-holders 134, as illustrated.

Referring now to FIGS. 22 and 23, the structure 100 is shown after removing the sacrificial spacers 128 according to an embodiment of the invention. FIG. 22 depicts a cross-sectional view of the structure 100 taken along line $X_1$-$X_1$, and FIG. 23 depicts a cross-sectional view of the structure 100 taken along line $X_2$-$X_2$.

The sacrificial spacers 128 are selectively removed according to known techniques. Specifically, the sacrificial spacers 128 are removed using known etching techniques suitable to remove aluminum oxide or titanium oxide selec-tive to the surrounding elements or materials. In an embodi-ment, the sacrificial spacers 128 are removed using an isotropic etch such as, for example, dry or wet etch. Remov-ing the sacrificial spacers 128 creates stepped openings 138.

Despite the first placeholders 134 being wider and deeper than the second placeholders 136, it is noted, that the stepped openings 138 are approximately aligned or at a similar level. Said differently, bottommost surfaces of the stepped open-ings 138 are substantially flush across all of the placeholders 134, 136. This is made possible because the sacrificial spacers 128 were formed on a planar top surface of the top semiconductor layer 116, and bottommost surfaces of the sacrificial spacers 128 were substantially flush across both transistor arrays (see FIGS. 14-21). Furthermore, removing the sacrificial spacers 128 further exposes sidewalls of top portions of the placeholders 134, 136, as illustrated.

Referring now to FIGS. 24 and 25, the structure 100 is shown after recessing the first placeholders 134 and the second placeholders 136 according to an embodiment of the invention. FIG. 24 depicts a cross-sectional view of the structure 100 taken along line $X_1$-$X_1$, and FIG. 25 depicts a cross-sectional view of the structure 100 taken along line $X_2$-$X_2$.

Next, exposed portions of the first placeholders 134 and the second placeholders 136 at the bottom of the openings 130, 132 are selectively etched according to known tech-niques. Specifically, in an embodiment, exposed surfaces of the first placeholders 134 and the second placeholders 136 are removed using an isotropic etch such as, for example, dry or wet etch. Doing so will recess both the first place-holders 134 and the second placeholders 136 to a similar level. Said differently, topmost surfaces of both the first placeholders 134 and the second placeholders 136 will be nearly uniform after recessing despite the first placeholders 134 being wider and deeper than the second placeholders 136, as illustrated. As used herein, nearly uniform refers to two surfaces having a substantially similar profile and substantially similar height. The resulting profiles of the placeholders 134, 136 are made possible because the iso-tropic etch attacks both the exposed sidewalls and the topmost surfaces of the placeholders 134, 136.

Critical to structures having different gate pitch, the embodiments disclosed herein ensure topmost surfaces of both the first placeholders 134 and the second placeholders 136 will be nearly uniform. In contrast, without the dis-closed embodiments topmost surfaces of the first placehold-ers 134 will be higher than topmost surfaces of the second placeholders 136 resulting from a single uniform deposition process. Different height placeholders can be particularly problematic. Specifically, the placeholders in the tight pitch devices must remain low enough to prevent covering or otherwise blocking the bottommost channel nanosheet 106, and the placeholders in the relaxed pitch devices must remain high enough to prevent voids from forming during source drain epitaxy.

Referring now to FIGS. 26 and 27, the structure 100 is shown after forming source drain regions 140 according to an embodiment of the invention. FIG. 26 depicts a cross-sectional view of the structure 100 taken along line $X_1$-$X_1$, and FIG. 27 depicts a cross-sectional view of the structure 100 taken along line $X_2$-$X_2$.

The source drain regions 140 are formed using an epi-taxial layer growth process on the exposed ends of the channel nanosheets 106 according to known techniques. Typically, in-situ doping is used to dope the source drain regions 140, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a P-type piece of silicon, rich in holes, and an N-type piece of silicon, rich in electrons. N-type and P-type devices are formed by using different types of dopants to select regions of the device to form the necessary junction(s). For example, N-type devices can be formed by doping with arsenic (As) or phosphorous (P), and p-type devices can be formed by doping with implanting boron (B).

According to embodiments of the present invention, at least some of the source drain regions 140 are of a first-type, for example, P-type, and at least some of the source drain regions 140 are of a second-type, for example, N-type.

With continued reference to FIGS. 26 and 27, the structure 100 is shown after forming a dielectric layer 142, selectively removing the sacrificial gates 120 and the first sacrificial nanosheets 104, and forming gate structures 144 according to an embodiment of the invention.

The dielectric layer 142 is formed by blanket depositing an interlayer dielectric material over the structure 100 according to known techniques. Specifically, the dielectric layer 142 is formed on the source drain regions 140 and substantially fills the remaining space between the spacer material 124, as illustrated.

The dielectric layer 142 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the dielectric layer 142. Using a self-planarizing dielectric material as the dielectric layer 142 can avoid the need to perform a subsequent planarizing step.

After the dielectric layer 142 is formed, the structure is polished according to known techniques, such as, for example, chemical mechanical polishing techniques. Specifically, the dielectric layer 142, the spacer material 124, and the gate hard mask 122 are polished until a topmost surface of the dielectric layer 142 is flush, or substantially flush, with topmost surfaces of the spacer material 124 and the sacrificial gates 120.

Next, the sacrificial gates 120 and the first sacrificial nanosheets 104 are selectively removed according to known techniques. First, the sacrificial gates 120 are etched and removed selective to the spacer material 124 and the nanosheet stacks 102 according to known techniques. Next, the first sacrificial nanosheets 104 are etched and removed selective to the channel nanosheets 106 and the inner spacers 126 according to known techniques. Doing so is made possible by the different concentrations of germanium. In this case, the layers with germanium are removed selective to layers without germanium.

Next, the gate structures 144 are formed according to known techniques. First, a gate dielectric (not shown) is conformally deposited directly on exposed surfaces of the structure 100 within the gate cavities or openings and spaces left by removing the sacrificial gates 120 and the first sacrificial nanosheets 104 according to known techniques. For example, the gate dielectric is conformally deposited on exposed surfaces of the channel nanosheets 106 and the inner spacers 126.

The gate dielectric is composed of any known gate dielectric materials, for example, oxide, nitride, and/or oxynitride. In an example, the gate dielectric can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials. For example, a silicon dioxide layer and a high-k gate dielectric layer can be formed and used together as the gate dielectric. In at least one embodiment, the gate dielectric is composed of hafnium oxide.

Next, a work function metal (not shown) is conformally deposited on the gate dielectric formed within the gate cavities according to known techniques. In at least one embodiment, the work function metal is made of the same conductive material across the entire structure. In at least another embodiment, the work function metal is made from different conductive materials in each of the devices illustrated the figures. In doing so, the different conductive materials would be deposited successively according to the design parameters and desired operation characteristics.

The work function metal can include any known conductive gate material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or titanium cabon (TiC), titanium aluminum (TiAl), titanium aluminum carbon (TiAlC), or multilayered combinations thereof. In some embodiments, the work function metal can include an nFET gate metal. In other embodiments, the work function metal can include a pFET gate metal. When multiple gate cavities are formed, as illustrated herein, embodiments of the present invention explicitly contemplate forming an nFET in at least one of the gate cavities and a pFET in at least another one of the gate cavities.

In some embodiments, gate metal or contact metal, is deposited directly on the work function metal, and fills the gate cavities. The first gate metal may include any suitable conductive material, such as, for example, copper, ruthenium, aluminum, tungsten, cobalt, or alloys thereof. After, excess conductive material can be polished using known techniques.

Figures 28, 29:
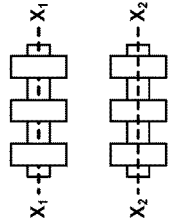
FIGS. 28 and 29 are cross-sectional views of the semiconductor structure after forming source drain contacts, middle-of-line and back-end-of-line and securing a carrier wafer according to an exemplary embodiment.

Referring now to FIGS. 28 and 29, the structure 100 is shown after forming source drain contacts 146, middle-of-line and back-end-of-line 148 and securing a carrier wafer 150 according to an embodiment of the invention. FIG. 28 depicts a cross-sectional view of the structure 100 taken along line $X_1$-$X_1$, and FIG. 29 depicts a cross-sectional view of the structure 100 taken along line $X_2$-$X_2$.

First, additional interlayer dielectric material is deposited according to known techniques. The dielectric layer 142 illustrated in the figures includes the additional interlayer dielectric material.

Next, portions of the dielectric layer 142 are removed to expose the source drain regions 140. Next, the openings are filled with a conductive material to form the source drain contacts 146 according to known techniques. The source drain contacts 146 may include any suitable conductive material, such as, for example, copper, ruthenium, aluminum, tungsten, cobalt, or alloys thereof. In some embodiments, a metal silicide is formed at the bottom of the contact trenches prior to filling them with the conductive material. In some embodiments, the source drain contacts 146 do not contact the spacer material 124. In other embodiments, the source drain contacts 146 are self-aligned to the spacer material 124, and thus may be referred to as self-aligned contact structures.

Finally, the middle-of-line and back-end-of-line 148 (hereinafter MOL/BEOL 148) is formed and carrier wafer 150 is secured to a top of the structure 100 according to an embodiment of the invention. After forming the source drain contacts 146, the MOL/BEOL 148 is subsequently formed according to known techniques. Next, the carrier wafer 150 is attached, or removably secured, to the MOL/BEOL 148. In general, and not depicted, the carrier wafer 150 may be thicker than the other layers. Temporarily bonding the structure 100 to a thicker carrier provides improved handling and additional support for backside processing of thin wafers. After backside processing described below, the structure 100 may be de-bonded, or removed, from the carrier wafer 150 according to known techniques.

Referring now to FIGS. 30 and 31, the structure 100 is shown after flipping the assembly and recessing the substrate 110 according to an embodiment of the invention. FIG. 30 depicts a cross-sectional view of the structure 100 taken along line $X_1$-$X_1$, and FIG. 31 depicts a cross-sectional view of the structure 100 taken along line $X_2$-$X_2$.

First, the structure 100 is flipped 180 degrees to prepare for backside processing. In general, backside processing includes fabrication or processing of the structure 100 opposite the active device and wiring layers. Next, the substrate 110 is recessed according to known techniques. Specifically, the base substrate 114 is recessed or completely removed to expose the etch stop layer 112, as shown.

Referring now to FIGS. 32 and 33, the structure 100 is shown after removing remaining portions of the substrate 110 according to an embodiment of the invention. FIG. 32 depicts a cross-sectional view of the structure 100 taken along line $X_1$-$X_1$, and FIG. 33 depicts a cross-sectional view of the structure 100 taken along line $X_2$-$X_2$.

First, the etch stop layer 112 and the top semiconductor layer 116 are selectively removed according to known techniques. Specifically, the etch stop layer 112 is removed selective to the top semiconductor layer 116 and the top semiconductor layer 116 is removed selective to the placeholders 134, 136 and the spacer material 124. Unique to the disclosed embodiments, the source drain regions 140 remain damage free during removal of the substrate 110 due to the existence of the placeholders 134, 136.

Referring now to FIGS. 34 and 35, the structure 100 is shown after forming a backside dielectric layer 152 according to an embodiment of the invention. FIG. 34 depicts a cross-sectional view of the structure 100 taken along line $X_1$-$X_1$, and FIG. 35 depicts a cross-sectional view of the structure 100 taken along line $X_2$-$X_2$.

The backside dielectric layer 152 is formed by blanket depositing an interlayer dielectric material over the structure 100 according to known techniques. Specifically, the backside dielectric layer 152 is formed on the placeholders 134, 136 and the spacer material 124, as illustrated.

The backside dielectric layer 152 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the backside dielectric layer 152. Using a self-planarizing dielectric material as the backside dielectric layer 152 can avoid the need to perform a subsequent planarizing step.

Referring now to FIGS. 36 and 37, the structure 100 is shown after forming backside contact trenches 156 according to an embodiment of the invention. FIG. 36 depicts a cross-sectional view of the structure 100 taken along line $X_1$-$X_1$, and FIG. 37 depicts a cross-sectional view of the structure 100 taken along line $X_2$-$X_2$.

First, a mask (not shown) is deposited and subsequently patterned to expose certain portions of the structure 100 according to known techniques. The mask can be an organic planarization layer (OPL) or a layer of material that is capable of being planarized or etched by known techniques. In an embodiment, for example, the mask can be an amorphous carbon layer able to withstand subsequent processing temperatures. The mask can preferably have a thickness sufficient to cover existing structures. After deposition of the mask, a dry etching technique is applied to pattern the mask according to known techniques.

Next, according to an exemplary embodiment, RIE is used to transfer the mask pattern into the backside dielectric layer 152 forming the backside contact trenches 156 according to known techniques and as illustrated. According to embodiments of the present invention, the backside contact trenches 156 are generally aligned with, and expose, one or more of the placeholders 134, 136, as illustrated.

Referring now to FIGS. 38 and 39, the structure 100 is shown after removing the placeholders 134, 136 exposed by the backside contact trenches 156 according to an embodiment of the invention. FIG. 38 depicts a cross-sectional view of the structure 100 taken along line $X_1$-$X_1$, and FIG. 39 depicts a cross-sectional view of the structure 100 taken along line $X_2$-$X_2$.

The placeholders 134, 136 exposed by the backside contact trenches 156 are selectively removed according to known techniques. Specifically, the placeholders 134, 136 exposed by the backside contact trenches 156 are etched or removed selective to the spacer material 124 and the source drain regions 140, as illustrated. For example, anisotropic etching techniques such as, for example, reactive ion etching can be used to remove the placeholders 134, 136.

Referring now to FIGS. 40 and 41, the structure 100 is shown after forming backside contact structures 158 and backside wiring layers 160 according to an embodiment of the invention. FIG. 40 depicts a cross-sectional view of the structure 100 taken along line $X_1$-$X_1$, and FIG. 41 depicts a cross-sectional view of the structure 100 taken along line $X_2$-$X_2$.

The backside contact trenches 156 are then filled with a conductive material to form the backside contact structures 158 according to known techniques. The backside contact structures 158 may include any suitable conductive material, such as, for example, copper, ruthenium, aluminum, tungsten, cobalt, or alloys thereof. In some embodiments, a metal silicide is formed at the bottom of the backside contact trenches 156 prior to filling them with the conductive material. After, excess conductive material can be polished using known techniques until bottommost surfaces of the backside contact structures 158 are flush, or substantially flush, with bottommost surfaces of the backside dielectric layer 152, as illustrated. It is noted, the backside contact structures 158 may include, for example, backside source drain contacts, as illustrated, as well as backside gate contacts. After forming the backside contact structures 158, the backside wiring layers 160 are subsequently formed according to known techniques.

With continued reference to FIGS. 40 and 41, and according to an embodiment, the structure 100 includes a first transistor including a first placeholder and a first gate pitch, and a second transistor including a second placeholder and a second gate pitch, where the first gate pitch is less than the second gate pitch, and where the first placeholder is smaller than the second placeholder.

With continued reference to FIGS. 40 and 41, and according to an embodiment, the structure 100 includes a first array of nanosheet transistors including first placeholders, and a second array of nanosheet transistors including second placeholders, where a first gate pitch of the first array of nanosheet transistors is less than a second gate pitch of the second array of nanosheet transistors, and where a bottommost surface of each of the second placeholders is below a bottommost surface of each of the first placeholders.

With continued reference to FIGS. 40 and 41, and according to an embodiment, the structure 100 includes a first array of nanosheet transistors including first placeholders adjacent to first backside source drain contacts, where the first array of nanosheet transistors includes a first gate pitch, and a second array of nanosheet transistors including second placeholders adjacent to second backside source drain contacts, where the first array of nanosheet transistors includes a second gate pitch, where the first gate pitch is less than the second gate pitch, and where a bottommost surface of each of the second placeholders is below a bottommost surface of each of the first placeholders.

With continued reference to FIGS. 40 and 41, and according to an embodiment, a topmost surface of the second placeholder is substantially flush with a topmost surface of the first placeholder.

With continued reference to FIGS. 40 and 41, and according to an embodiment, at least a first portion of the first placeholder is substantially flush with a topmost surface of a backside dielectric layer and at least a second portion of the first placeholder extends above the topmost surface of the backside dielectric layer, and at least a first portion of the second placeholder is substantially flush with the topmost surface of the backside dielectric layer and at least a second portion of the second placeholder extends above the topmost surface of the backside dielectric layer.

With continued reference to FIGS. 40 and 41, and according to an embodiment, the first transistor further includes a first source drain region, an interface between the first placeholder and the first source drain region is curved, and the second transistor further includes a second source drain region, an interface between the second placeholder and the second source drain region is curved.

With continued reference to FIGS. 40 and 41, and according to an embodiment, the first transistor further includes a first source drain region, the second transistor further includes a second source drain region, and a width of the first source drain region is less than a width of the second source drain region.

With continued reference to FIGS. 40 and 41, and according to an embodiment, the first transistor further includes a first backside source drain contact, a topmost surface of the first backside source drain contact has a substantially similar profile to a topmost surface of the first placeholder, and the second transistor further includes a second backside source drain contact, a topmost surface of the second backside source drain contact has a substantially similar profile to a topmost surface of the second placeholder.

With continued reference to FIGS. 40 and 41, and according to an embodiment, the first transistor further includes a first backside source drain contact, at least a first portion of the first backside source drain contact is substantially flush with a topmost surface of a backside dielectric layer and at least a second portion of the first backside source drain contact extends above the topmost surface of the backside dielectric layer, and the second transistor further includes a second backside source drain contact, at least a first portion of the second backside source drain contact is substantially flush with the topmost surface of the backside dielectric layer and at least a second portion of the second backside source drain contact extends above the topmost surface of the backside dielectric layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a first transistor comprising a first placeholder and a first gate pitch, wherein at least a first portion of the first placeholder extends above a topmost surface of a backside dielectric layer; and
a second transistor comprising a second placeholder and a second gate pitch, wherein at least a first portion of the second placeholder extends above the topmost surface of the backside dielectric layer, and
wherein the first gate pitch is less than the second gate pitch, and wherein the first placeholder is smaller than the second placeholder.

2. The semiconductor structure according to claim 1, wherein a topmost surface of the second placeholder is substantially flush with a topmost surface of the first placeholder.

3. The semiconductor structure according to claim 1,
wherein at least a second portion of the first placeholder is substantially flush with the topmost surface of the backside dielectric layer, and
wherein at least a second portion of the second placeholder is substantially flush with the topmost surface of the backside dielectric layer.

4. The semiconductor structure according to claim 1,
wherein the first transistor further comprises a first source drain region, wherein an interface between the first placeholder and the first source drain region is curved, and
wherein the second transistor further comprises a second source drain region, wherein an interface between the second placeholder and the second source drain region is curved.

5. The semiconductor structure according to claim 1,
wherein the first transistor further comprises a first source drain region,
wherein the second transistor further comprises a second source drain region, and
wherein a width of the first source drain region is less than a width of the second source drain region.

6. The semiconductor structure according to claim 1, wherein the first transistor further comprises a first backside source drain contact, wherein a topmost surface of the first backside source drain contact has a substantially similar profile to a topmost surface of the first placeholder, and wherein the second transistor further comprises a second backside source drain contact, wherein a topmost surface of the second backside source drain contact has a substantially similar profile to a topmost surface of the second placeholder.

7. The semiconductor structure according to claim 1, wherein the first transistor further comprises a first backside source drain contact, wherein at least a first portion of the first backside source drain contact is substantially flush with the topmost surface of the backside dielectric layer and at least a second portion of the first backside source drain contact extends above the topmost surface of the backside dielectric layer, and wherein the second transistor further comprises a second backside source drain contact, wherein at least a first portion of the second backside source drain contact is substantially flush with the topmost surface of the backside dielectric layer and at least a second portion of the second backside source drain contact extends above the topmost surface of the backside dielectric layer.

8. A semiconductor structure comprising:

a first array of nanosheet transistors comprising first placeholders; and a second array of nanosheet transistors comprising second placeholders;

wherein a first gate pitch of the first array of nanosheet transistors is less than a second gate pitch of the second array of nanosheet transistors, and wherein a bottommost surface of each of the second placeholders is below a bottommost surface of each of the first placeholders.

9. The semiconductor structure according to claim 8, wherein a topmost surface of each of the second placeholders is substantially flush with a topmost surface of each of the first placeholders.

10. The semiconductor structure according to claim 8, wherein at least a first portion of each of the first placeholders is substantially flush with a topmost surface of a backside dielectric layer and at least a second portion of each of the first placeholders extends above the topmost surface of the backside dielectric layer, and wherein at least a first portion of each of the second placeholders is substantially flush with the topmost surface of the backside dielectric layer and at least a second portion of each of the second placeholders extends above the topmost surface of the backside dielectric layer.

11. The semiconductor structure according to claim 8, wherein the first array of nanosheet transistors further comprises first source drain regions, wherein an interface between each of the first placeholders and each of the first source drain regions is curved, and wherein the second array of nanosheet transistors further comprises second source drain regions, wherein an interface between each of the second placeholders and each of the second source drain regions is curved.

12. The semiconductor structure according to claim 8, wherein the first array of nanosheet transistors further comprises first source drain regions, wherein the second array of nanosheet transistors further comprises second source drain regions, and wherein a width of each of the first source drain regions is less than a width of each of the second source drain regions.

13. The semiconductor structure according to claim 8, wherein the first array of nanosheet transistors further comprises first backside source drain contacts, wherein a topmost surface of each of the first backside source drain contacts has a substantially similar profile to a topmost surface of each of the first placeholders, and wherein the second array of nanosheet transistors further comprises second backside source drain contacts, wherein a topmost surface of each of the second backside source drain contacts has a substantially similar profile to a topmost surface of each of the second placeholders.

14. The semiconductor structure according to claim 8, wherein the first array of nanosheet transistors further comprises first backside source drain contacts, wherein at least a first portion of each of the first backside source drain contacts is substantially flush with a topmost surface of a backside dielectric layer and at least a second portion of each of the first backside source drain contacts extends above the topmost surface of the backside dielectric layer, and wherein the second array of nanosheet transistors further comprises second backside source drain contacts, wherein at least a first portion of each of the second backside source drain contacts is substantially flush with the topmost surface of the backside dielectric layer and at least a second portion of each of the second backside source drain contacts extends above the topmost surface of the backside dielectric layer.

15. A semiconductor structure comprising:

a first array of nanosheet transistors comprising first placeholders adjacent to first backside source drain contacts, wherein the first array of nanosheet transistors comprises a first gate pitch; and a second array of nanosheet transistors second placeholders adjacent to second backside source drain contacts, wherein the second array of nanosheet transistors comprises a second gate pitch;

wherein the first gate pitch is less than the second gate pitch, and wherein a bottommost surface of each of the second placeholders is below a bottommost surface of each of the first placeholders.

16. The semiconductor structure according to claim 15, wherein a topmost surface of each of the second placeholders is substantially flush with a topmost surface of each of the first placeholders.

17. The semiconductor structure according to claim 15, wherein at least a first portion of each of the first placeholders is substantially flush with a topmost surface of a backside dielectric layer and at least a second portion of each of the first placeholders extends above the topmost surface of the backside dielectric layer, and wherein at least a first portion of each of the second placeholders is substantially flush with the topmost surface of the backside dielectric layer and at least a second portion of each of the second placeholders extends above the topmost surface of the backside dielectric layer.

18. The semiconductor structure according to claim 15, wherein the first array of nanosheet transistors further comprises first source drain regions, wherein an interface between each of the first placeholders and each of the first source drain regions is curved, and wherein the second array of nanosheet transistors further comprises second source drain regions, wherein an interface between each of the second placeholders and each of the second source drain regions is curved.

19. The semiconductor structure according to claim 15, wherein a topmost surface of each of the first backside source drain contacts has a substantially similar profile to a topmost surface of each of the first placeholders, and wherein a topmost surface of each of the second backside source drain contacts has a substantially similar profile to a topmost surface of each of the second placeholders.

20. The semiconductor structure according to claim 15, wherein at least a first portion of each of the first backside source drain contacts is substantially flush with a topmost surface of a backside dielectric layer and at least a second portion of each of the first backside source drain contacts extends above the topmost surface of the backside dielectric layer, and wherein at least a first portion of each of the second backside source drain contacts is substantially flush with the topmost surface of the backside dielectric layer and at least a second portion of each of the second backside source drain contacts extends above the topmost surface of the backside dielectric layer.

* * * * *